US012776754B2

(12) United States Patent
Mizuno et al.

(10) Patent No.: US 12,776,754 B2
(45) Date of Patent: Oct. 27, 2026

(54) ELECTRONIC COMPONENT

(71) Applicant: Murata Manufacturing Co., Ltd., Nagaokakyo (JP)

(72) Inventors: Takaaki Mizuno, Nagaokakyo (JP); Toshiyuki Nakaiso, Nagaokakyo (JP); Kenji Toyoshima, Nagaokakyo (JP); Yoshimasa Yoshioka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 130 days.

(21) Appl. No.: 19/011,906

(22) Filed: Jan. 7, 2025

(65) Prior Publication Data

US 2025/0150050 A1 May 8, 2025

Related U.S. Application Data

(63) Continuation of application No. PCT/JP2023/021861, filed on Jun. 13, 2023.

(30) Foreign Application Priority Data

Jul. 13, 2022 (JP) ................................ 2022-112586

(51) Int. Cl.
*H03H 1/00* (2006.01)
*H03H 11/04* (2006.01)
*H03H 11/28* (2006.01)

(52) U.S. Cl.
CPC ....... *H03H 1/00* (2013.01); *H03H 2001/0078* (2013.01); *H03H 2001/0085* (2013.01); *H03H 11/04* (2013.01); *H03H 11/28* (2013.01)

(58) Field of Classification Search
CPC .......... H03H 1/00; H03H 11/04; H03H 11/28; H03H 2001/0078; H03H 2001/0085;
(Continued)

(56) References Cited

U.S. PATENT DOCUMENTS 10,650,949 B2 5/2020 Asano et al.
11,587,711 B2 2/2023 Tanabe et al.
(Continued)

FOREIGN PATENT DOCUMENTS

JP 2003-249832 A 9/2003
JP 2004-079973 A 3/2004
(Continued)

OTHER PUBLICATIONS

International Search Report received for PCT Patent Application No. PCT/JP2023/021861, mailed on Jul. 25, 2023, 2 pages (English translation only).

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

An electronic component is provided that includes a substrate, an insulator layer expanding over a surface of the substrate, a planar conductor on the substrate or in the insulator layer and expanding in a plane parallel to the surface of the substrate, and an inductor conductor pattern on the insulator layer or in the insulator layer. When viewed in a direction perpendicular to the surface of the substrate, a length in a longitudinal direction of a region in which a region with the inductor conductor pattern overlapping the planar conductor is represented by Ls, and a distance between the inductor conductor pattern and the planar conductor is represented by d, such that Ls/d is 1 or more and 60 or less.

20 Claims, 21 Drawing Sheets

(58) Field of Classification Search
CPC ....... H03H 7/0115; H10P 14/40; H01F 17/00; H01F 27/00; H10D 84/00; H10D 84/038
See application file for complete search history.

(56) References Cited

U.S. PATENT DOCUMENTS

| | | | |
|---|---|---|---|
| 2019/0148047 | A1 | 5/2019 | Asano et al. |
| 2019/0311832 | A1 | 10/2019 | Tanabe et al. |

FOREIGN PATENT DOCUMENTS

| | | | |
|---|---|---|---|
| JP | 2005-020577 | A | 1/2005 |
| JP | 2010-239380 | A | 10/2010 |
| JP | 2011-233807 | A | 11/2011 |
| JP | 2012-178717 | A | 9/2012 |
| JP | 2019-091847 | A | 6/2019 |
| JP | 2019-186696 | A | 10/2019 |
| WO | 2015/037374 | A1 | 3/2015 |

〈PLAN VIEW〉

〈CROSS-SECTIONAL VIEW〉

〈PLAN VIEW〉

〈CROSS-SECTIONAL VIEW〉

〈PLAN VIEW〉

〈CROSS-SECTIONAL VIEW〉

〈PLAN VIEW〉

〈CROSS-SECTIONAL VIEW〉

〈PLAN VIEW〉

105

〈CROSS-SECTIONAL VIEW〉

ELECTRONIC COMPONENT

CROSS REFERENCE TO RELATED APPLICATIONS

This application is a continuation of International Application No. PCT/JP2023/021861, filed Jun. 13, 2023, which claims priority to Japanese Patent Application No. 2022-112586, filed Jul. 13, 2022, the contents of each of which are hereby incorporated by reference in their entirety.

TECHNICAL FIELD

The present disclosure relates to an electronic component including a conductor pattern that configures a capacitor or an inductor on a substrate.

BACKGROUND

Currently, an electronic component that includes a conductor pattern to configure a capacitor or an inductor on a substrate is used, for example, as an LC composite component.

For example, Japanese Unexamined Patent Application Publication No. 2004-079973 discloses an LC composite component in which a capacitor electrode is outside an air core portion of a coil configured by a helical conductor pattern.

Moreover, Japanese Unexamined Patent Application Publication No. 2012-178717 discloses an LC composite component in which capacitor electrodes do not overlap with each other at a center axis of a coil conductor configured by a spiral conductor pattern.

Furthermore, Japanese Unexamined Patent Application Publication No. 2019-091847 discloses an LC composite component in which a capacitor by a comb-shaped electrode is disposed in an upper layer or a lower layer other than a central region of a coil conductor configured by a spiral conductor pattern. In this aspect, the comb-shaped electrode is perpendicular to inductor conductor wiring.

In the LC composite element disclosed in the above-noted publications, a magnetic field generated in a coil does not pass through an electrode of a capacitance portion, so that a Q value of an inductor does not deteriorate. However, in the LC composite component of these structures, since it is necessary to dispose a capacitor electrode to avoid the central portion of the coil, a plane area of the LC composite component is increased. In short, a desired capacitance cannot be ensured when the capacitor electrode is disposed so as avoid the central portion of the coil, and a desired inductance cannot be ensured when a coil conductor is disposed so as avoid the capacitor electrode. As a result, the LC composite component cannot be reduced in size.

The above-described problems occur not only for an LC composite component by a composite of an inductor and a capacitor, but similarly for an electronic component including a planar conductor and an inductor conductor pattern.

SUMMARY OF THE INVENTION

In view of the foregoing, exemplary embodiments of the present disclosure provide an electronic component that has a reduced size while including an inductor conductor pattern that is configured to generate a desired inductance and a planar conductor that has a desired size.

Specifically, in an exemplary aspect, an electronic component is provided that includes a substrate, an insulator layer expanding over a surface of the substrate, a single or a plurality of planar conductors on the substrate or in the insulator layer and that expand in a plane parallel to the surface of the substrate, and an inductor conductor pattern on the insulator layer or in the insulator layer. Moreover, when viewed in a direction perpendicular to the surface of the substrate, a length in a longitudinal direction of a single region in which a region where the inductor conductor pattern overlaps the single or the plurality of planar conductors, or a length in the longitudinal direction being a total length in a predetermined direction of a plurality of regions in which the region where the inductor conductor pattern overlaps the single or a plurality of planar conductors is represented by Ls. In this aspect, a distance between the inductor conductor pattern and the planar conductor closest to the inductor conductor pattern is represented by d and Ls/d is 1 or more and 60 or less.

According to the exemplary embodiments of the present disclosure, an electronic component with a reduced size is provided that includes an inductor conductor pattern that generates a desired inductance and a planar conductor that has a desired size.

DETAILED DESCRIPTION OF EXEMPLARY EMBODIMENTS

Figure 1A:
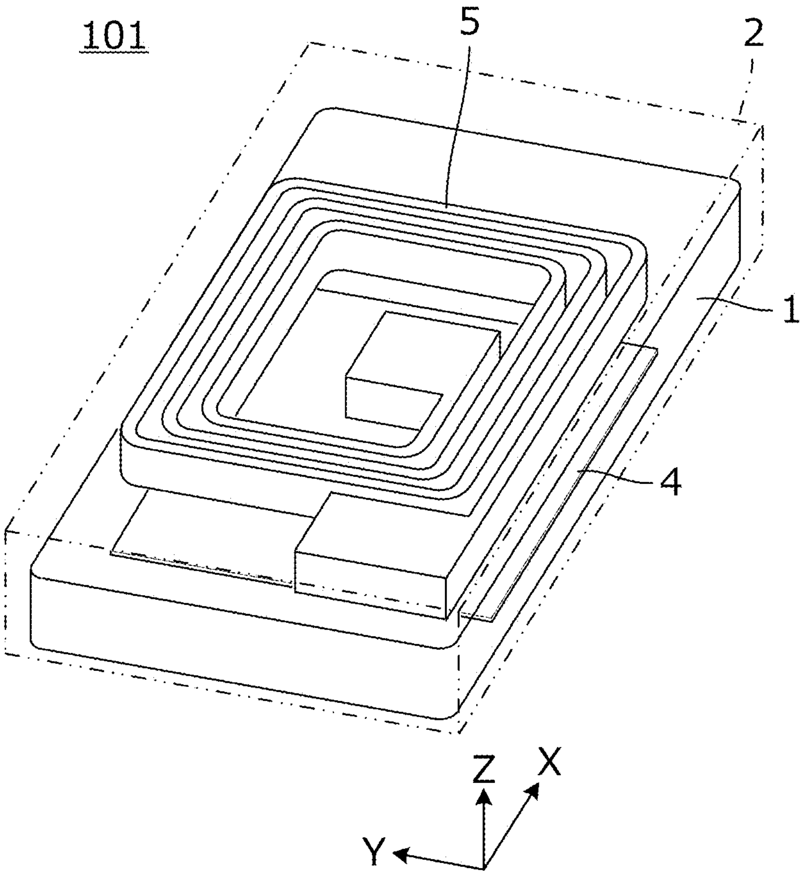
FIGS. 1A and 1B show a perspective view and a front view of an electronic component 101 according to a first exemplary embodiment of the present disclosure.

Hereinafter, a plurality of exemplary embodiments of the present disclosure will be described with reference to the attached drawings and several specific examples. In the drawings, components and elements assigned with the same reference numerals or symbols will represent identical components and elements. It is noted that while an exemplary embodiment of the present disclosure is divided and described into a plurality of exemplary aspects for the sake of convenience in consideration of ease of description or understanding of main points, elements described in different exemplary embodiments can be partially replaced or combined with each other as would be appreciated to one skilled in the art. Moreover, in the second and subsequent exemplary embodiments, a description of features common to the first exemplary embodiment will be omitted, and only different features will be described. In particular, the same advantageous functions and effects by the same configurations will not be described one by one for each exemplary embodiment.

First Exemplary Embodiment

Figure 1B:
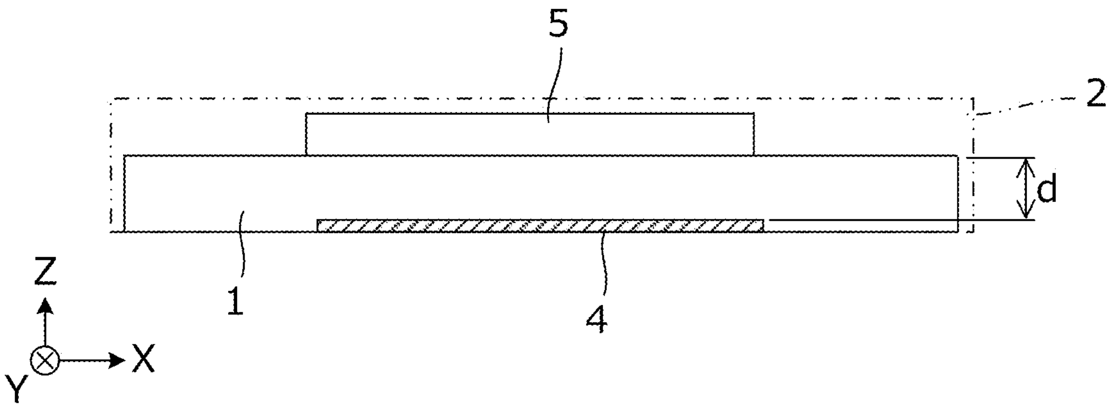

FIG. 1A is a cross-sectional view of an electronic component 101 according to a first exemplary embodiment of the present disclosure. In this perspective view, the outer shape is indicated by a two-dot chain line. FIG. 1B is a front view of the electronic component 101 viewed in a Y-axis direction.

This electronic component 101 includes a substrate 1 having an electrical insulating property, an insulator layer 2 expanding along (e.g., over) a surface of this substrate 1, a planar conductor 4 provided on the substrate 1 or in the insulator layer 2 and expanding in a plane parallel to the surface of the substrate 1, and an inductor conductor pattern 5, such as a rectangular spiral coil type, on the substrate 1 or in the insulator layer 2.

Figure 2A:
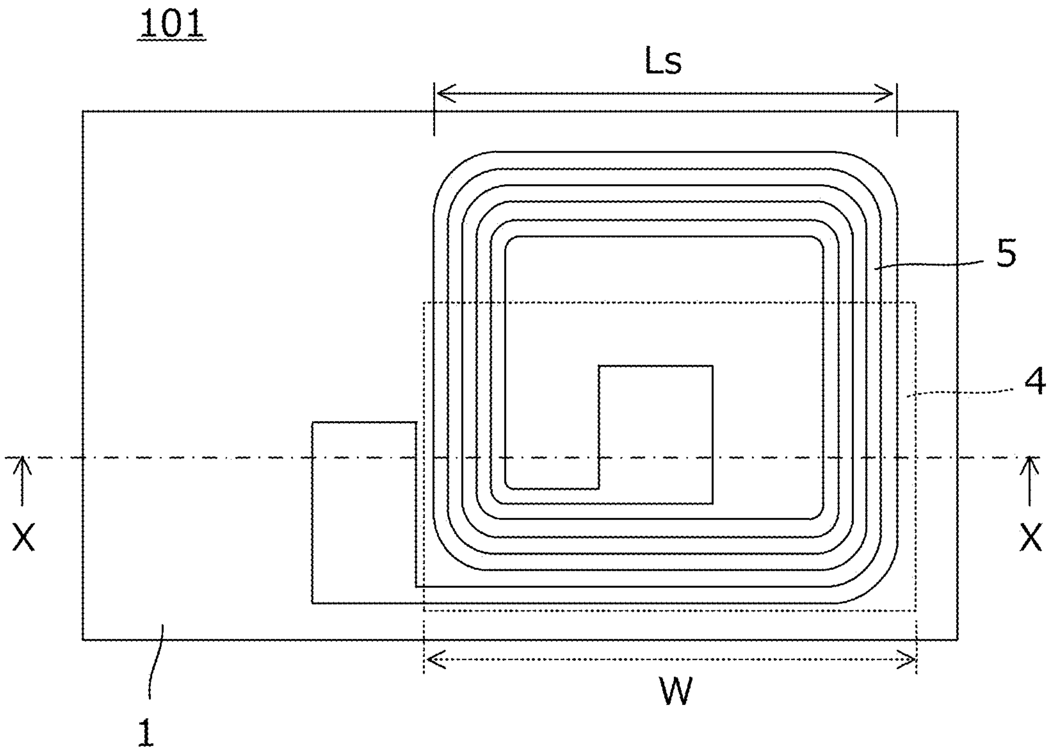
FIGS. 2A and 2B show a plan view and a cross-sectional view of a main portion of the electronic component 101.
Figure 2B:
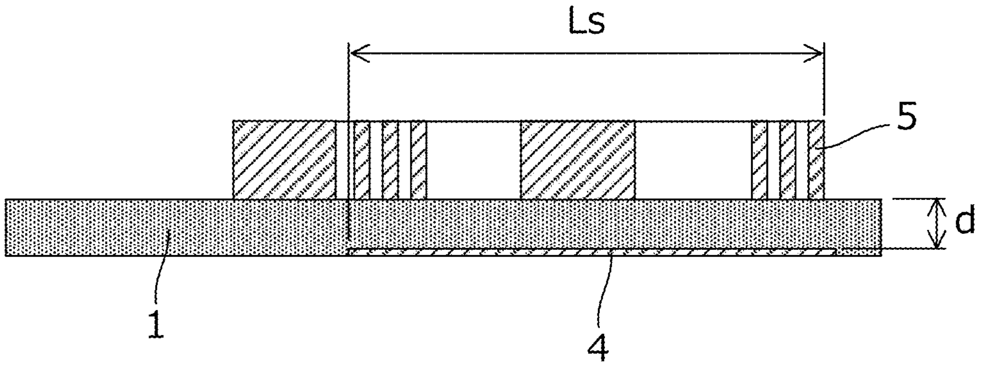
Figure 3:
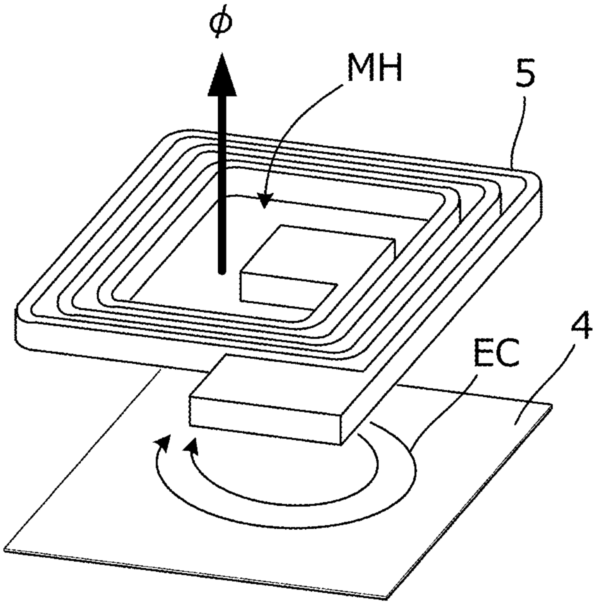
FIG. 3 is a perspective view showing a positional relationship between an inductor conductor pattern 5 and a planar conductor 4.

FIG. 2A is a plan view of a main portion of the electronic component 101, and FIG. 2B is a cross-sectional view taken along a line X-X in the plan view. FIG. 3 is a perspective view showing a positional relationship between the inductor conductor pattern 5 and the planar conductor 4. However, for convenience of description, a distance between the inductor conductor pattern 5 and the planar conductor 4 is purposely drawn in an expanded manner.

The inductor conductor pattern 5 has an aperture MH of magnetic flux φ in which the magnetic flux is concentrated, and an eddy current EC flows into the planar conductor 4 according to this magnetic flux (e.g., high frequency magnetic flux) φ. This current EC increases as the magnetic flux φ is increased.

For purposes of this disclosure, the width of the planar conductor 4 is represented by W in FIG. 2A. When the distance in the thickness direction between the inductor conductor pattern 5 and the planar conductor 4 is represented by d, the eddy current EC is increased as the distance d in the thickness direction between the inductor conductor pattern 5 and the planar conductor 4 is reduced. In addition, when viewed in a direction perpendicular to the surface of the substrate 1, a length in a longitudinal direction of a region in which a region where the inductor conductor pattern 5 overlaps the planar conductor 4 is represented by Ls. The eddy current EC increases as Ls is increased. Accordingly, the eddy current EC increases as a value of Ls/d is increased.

Table 1 is a table showing a relationship between the length Ls in a longitudinal direction of a region in which a region with the inductor conductor pattern 5 overlaps with the planar conductor 4, the distance d between the inductor conductor pattern 5 and the planar conductor 4, deterioration of a Q value of an inductor, and the like.

TABLE 1

| Ls[μm] | d[μm] | S[μm$^2$] | √(S)/d (=Ls/d) | Q/Q0 | L/L0 |
|---|---|---|---|---|---|
| 330 | 3.5 | 108900 | 94.3 | 0.11 | 0.37 |
| 310 | 3.5 | 96100 | 88.6 | 0.12 | 0.41 |
| 290 | 3.5 | 84100 | 82.9 | 0.14 | 0.47 |
| 270 | 3.5 | 72900 | 77.1 | 0.18 | 0.55 |
| 230 | 3.5 | 52900 | 65.7 | 0.26 | 0.72 |
| 210 | 3.5 | 44100 | 60.0 | 0.32 | 0.80 |
| 190 | 3.5 | 36100 | 54.3 | 0.36 | 0.85 |
| 170 | 3.5 | 28900 | 48.6 | 0.38 | 0.88 |
| 150 | 3.5 | 22500 | 42.9 | 0.39 | 0.91 |
| 150 | 10 | 22500 | 15.0 | 0.46 | 0.93 |
| 150 | 20 | 22500 | 7.5 | 0.54 | 0.94 |
| 230 | 45 | 52900 | 5.1 | 0.72 | 0.97 |
| 210 | 100 | 44100 | 2.1 | 0.97 | 0.98 |
| 170 | 100 | 28900 | 1.7 | 1.00 | 1.00 |
| 250 | 250 | 62500 | 1.0 | 1.00 | 1.00 |
| 170 | 210 | 28900 | 0.8 | 1.00 | 1.00 |
| 170 | 330 | 28900 | 0.5 | 1.00 | 1.00 |

In Table 1, S [μm2] shows an area where the region where the inductor conductor pattern 5 overlaps the planar conductor 4 is a square. In addition, Q0 in Table 1 is the Q value of the inductor by the inductor conductor pattern 5 in a state without the planar conductor 4, and Q/Q0 is a ratio of a Q value to Q0, in a case in which the planar conductor of an area S [μm2] is disposed at a distance d [μm] away from the inductor conductor pattern 5. In addition, L0 is inductance of the inductor conductor pattern 5 in the state without the planar conductor 4, and L/L0 is a ratio of an L value to L0, in the case in which the planar conductor of an area S [μm2] is disposed at a distance d [μm] away from the inductor conductor pattern 5.

Figure 4:
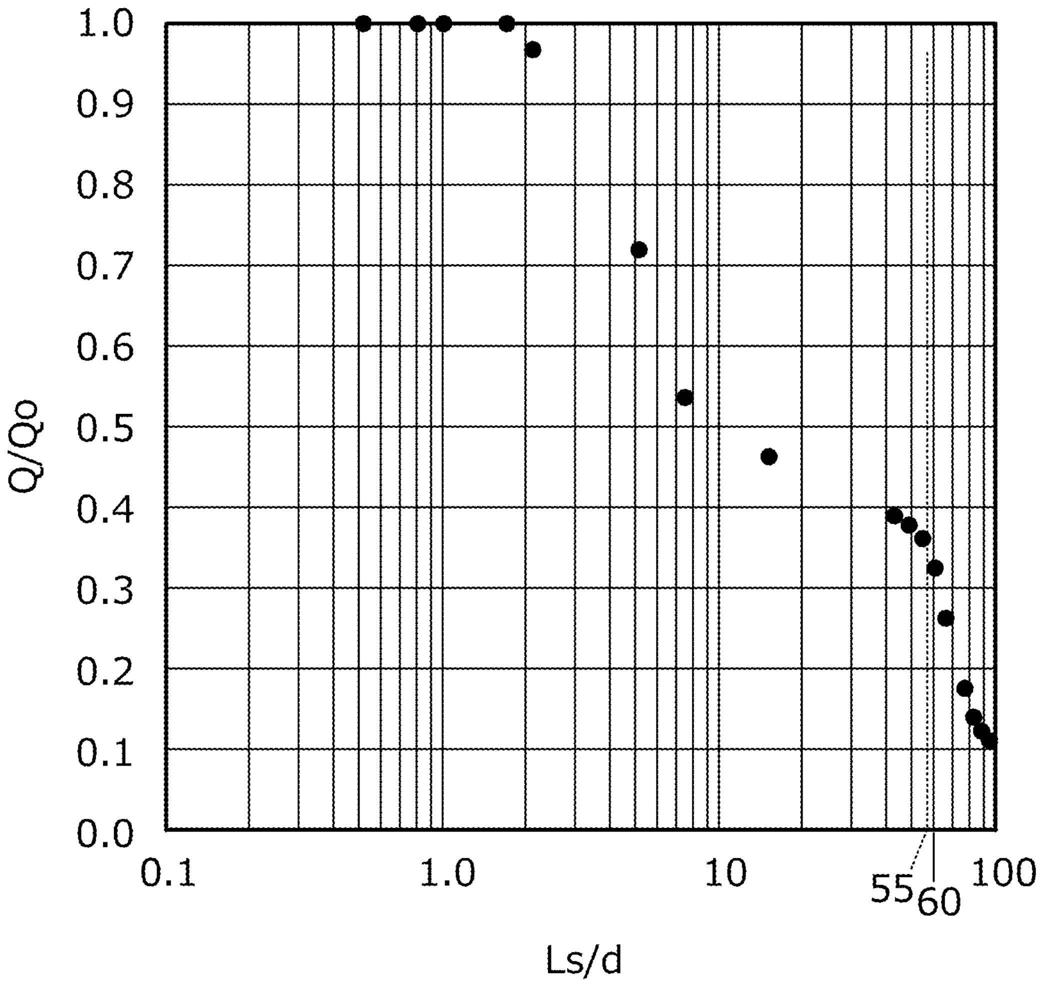
FIG. 4 is a view showing a tendency of Ls/d and Q/Q0 found from combinations of a plurality of Ls and d.

FIG. 4 is a view showing a tendency of Ls/d and Q/Q0 found from combinations of the plurality of Ls and d. In FIG. 4, a horizontal axis represents Ls/d and a vertical axis represents Q/Q0. As apparent from FIG. 4, Q/Q0 is 0.3 or more in a range in which a value (i.e., a value of V(S)/d) of Ls/d is 1 or more and 60 or less, so that a reduction in the Q value of the inductor due to the presence of the planar conductor 4 is minimized. Moreover, in a range in which the value of Ls/d is 1 or more and 55 or less, the reduction in Q/Q0 is further significantly reduced.

The example of Table 1 and FIG. 4 is an example in the case in which the region where the inductor conductor pattern 5 overlaps the planar conductor 4 is a square, that is, the worst case, so that, in a case in which the region where the inductor conductor pattern 5 overlaps the planar conductor 4 is not a square, a length in the longitudinal direction of this overlapped region may be defined as Ls.

In the example shown in FIGS. 1A and 1B, while viewed in the direction perpendicular to the surface of the substrate 1, the region where the inductor conductor pattern 5 overlaps the planar conductor 4 includes a single region, but in a case in which this region includes a plurality of regions, a length in the longitudinal direction can be a total length in a predetermined direction of the plurality of regions in which the region where the inductor conductor pattern 5 overlaps the planar conductor 4 that may be defined as Ls.

Figure 5A:
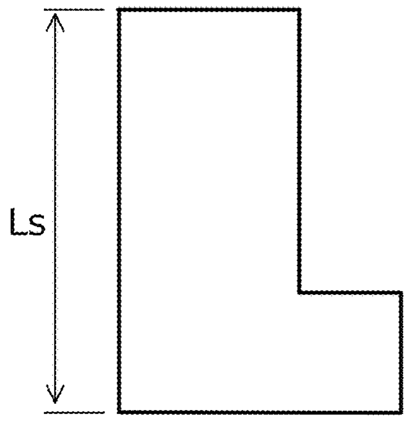
FIG. 5A, FIG. 5B, FIG. 5C, and FIG. 5D are views showing examples of a shape of a region in which a region with the inductor conductor pattern 5 overlaps with the planar conductor 4.
Figure 5B:
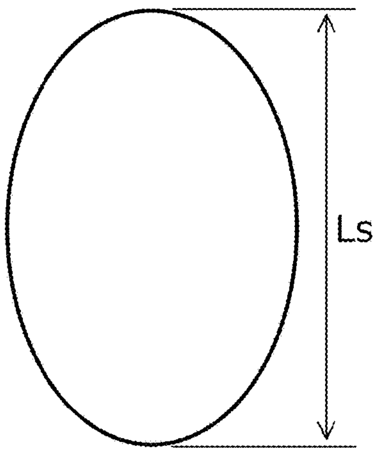
Figure 5C:
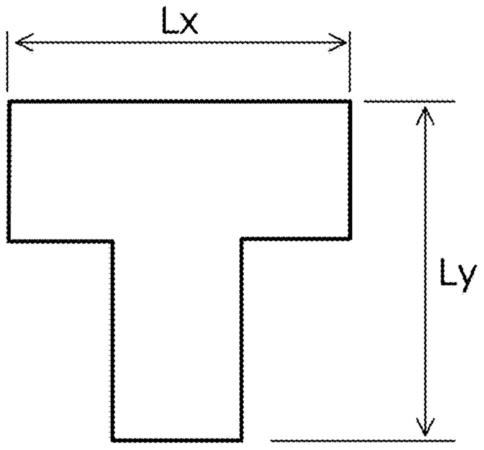

FIG. 5A, FIG. 5B, FIG. 5C, and FIG. 5D are views showing examples of a shape of the region in which the region with the inductor conductor pattern 5 overlaps the planar conductor 4. As shown in FIG. 5A, when a region of the planar conductor 4 that overlaps the region of the inductor conductor pattern 5 is an L shape, a length in the longitudinal direction in the region is set to Ls. In addition, as shown in FIG. 5B, when the region of the planar conductor 4 that overlaps the region of the inductor conductor pattern 5 is a round shape or an ellipse shape, a length in the longitudinal direction in the region is set to Ls. Further, as shown in FIG. 5C, when the region of the planar conductor 4 that overlaps the region of the inductor conductor pattern 5 is a T shape, a length in a direction of either a width Lx or a height Ly of the region being the longitudinal direction is set to Ls as described above.

Figure 5D:
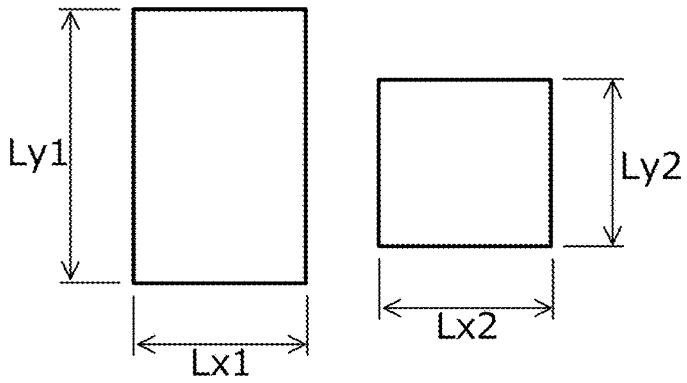

Moreover, as shown in FIG. 5D, in a case in which the region of the planar conductor that overlaps the region of the inductor conductor pattern 5 includes a plurality of regions, the length in the longitudinal direction is a total length in a predetermined direction of these overlapped regions that is set to Ls. In the example shown in FIG. 5D, out of two regions of the planar conductor that overlaps with the region of the inductor conductor pattern 5, a length in an X-axis direction in one region is Lx1, a length in a Y-axis direction in the one region is Ly1, a length in the X-axis direction in the other region is Lx2, and a length in the Y-axis direction in the other region is Ly2. In this example, since the total length of Ly1+Ly2 is larger than the total length of Lx1+Lx2, the value of this Ly1+Ly2 is the length Ls in the longitudinal direction.

Second Exemplary Embodiment

Figure 6A:
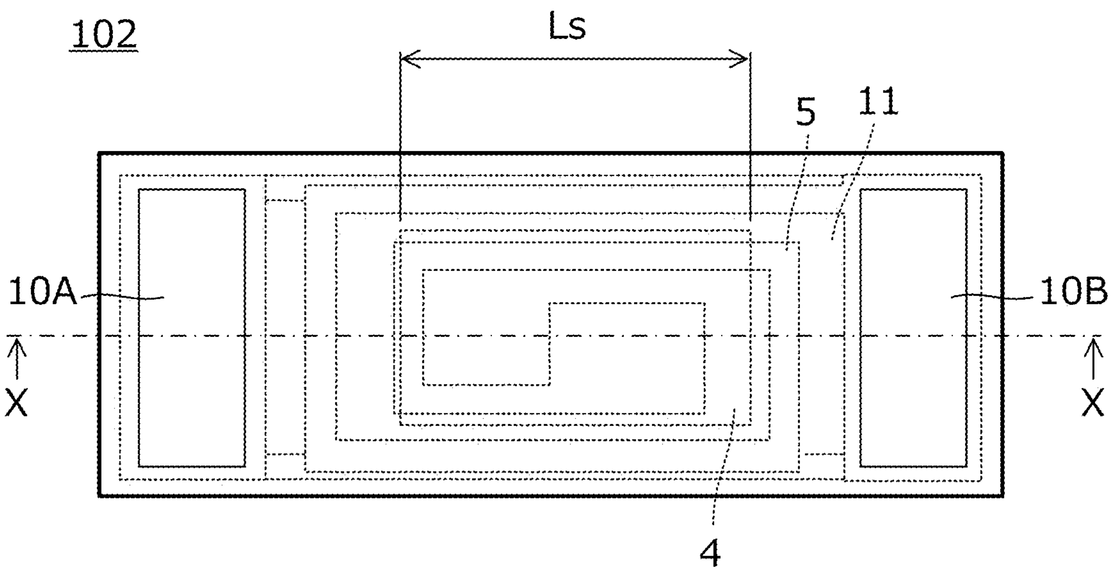
FIGS. 6A and 6B show a plan view and a cross-sectional view of an electronic component 102 according to a second exemplary embodiment of the present disclosure.
Figure 6B:
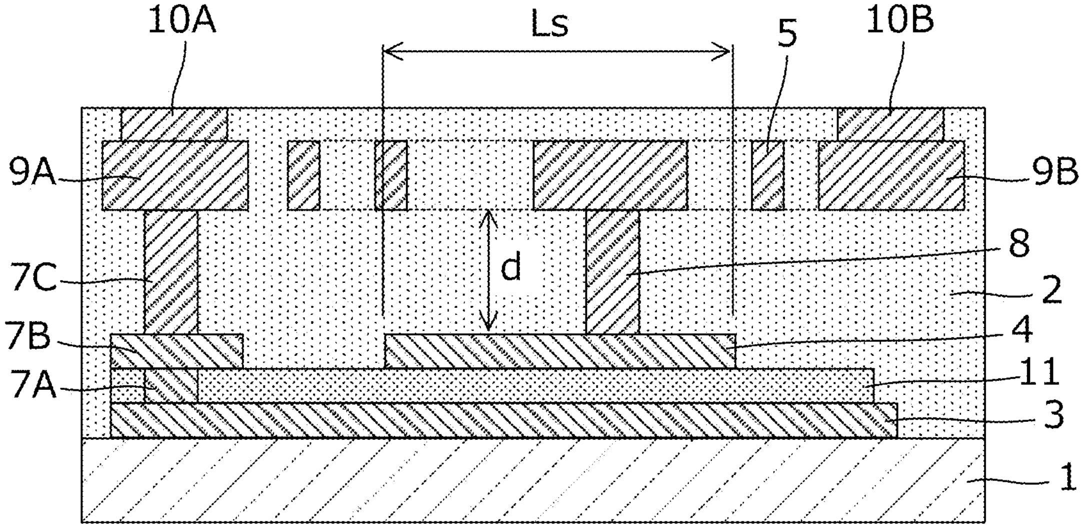

In a second exemplary embodiment, an LC composite electronic component will be exemplified. FIG. 6A is a plan view of an electronic component 102 according to the second exemplary embodiment of the present disclosure, and FIG. 6B is a cross-sectional view taken along a line X-X in the upper portion of FIG. 6A.

As shown, the electronic component 102 includes a substrate 1, an insulator layer 2 expanding along (e.g., over) a surface of the substrate 1, an inductor provided in the insulator layer 2, planar conductors 3 and 4 provided on the substrate 1 and extending along the substrate 1, planar conductor connecting conductors 7A, 7B, and 7C electrically connected to the planar conductor 3, and a planar conductor connecting conductor 8 electrically connected to the planar conductor 4.

Terminal electrodes 10A and 10B are provided on a surface of the insulator layer 2. The terminal electrodes 10A and 10B are electrically connected to terminal electrodes 9A and 9B.

The inductor is an inductor of a spiral coil type by the inductor conductor pattern 5 along the surface of the substrate 1.

The planar conductors 3 and 4 are capacitor electrodes. In short, the planar conductors 3 and 4, and a dielectric layer 11 interposed between these planar conductors 3 and 4 configure a capacitor. In other words, the planar conductors 3 and 4 are capacitor electrodes that configure a capacitor together with the dielectric layer 11.

When viewed in a direction perpendicular to the surface of the substrate 1, a region of the inductor conductor pattern 5 overlaps the planar conductor 3 and also overlaps with the planar conductor 4. Since the planar conductor 4 is closer to the inductor conductor pattern 5 than the planar conductor 3, a distance between the inductor conductor pattern 5 and the planar conductor 4 is represented by d. In addition, a length in the longitudinal direction of the largest region among regions in which the inductor conductor pattern 5 overlaps the planar conductor 4 is represented by Ls.

In FIGS. 6A and 6B, and according to an exemplary aspect, the value of Ls is 190 μm, and the distance d between the inductor conductor pattern 5 and the planar conductor 4 is 20 μm. Accordingly, Ls/d is 9.5, and Ls/d is less than 60 and further less than 55. As a result of creation and simulation of the structure model shown in FIGS. 6A and 6B, according to the present exemplary embodiment, the ratio Q/Q0 of the Q value Q0 without the planar conductor 4 to the Q value with the planar conductor 4 is 0.48, and, although the Q value is reduced, it is not extremely reduced so that an electronic component including an inductor with an effective Q value is provided.

Figure 7:
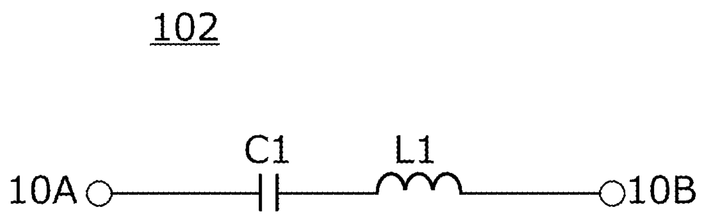
FIG. 7 is an equivalent circuit diagram of the electronic component 102.

FIG. 7 is an equivalent circuit diagram of the electronic component 102. In such a manner, the electronic component 102 configures a series circuit of the inductor L1 and the capacitor C1. This electronic component 102 can be configured as a frequency filter or an impedance matching circuit.

Figure 8:
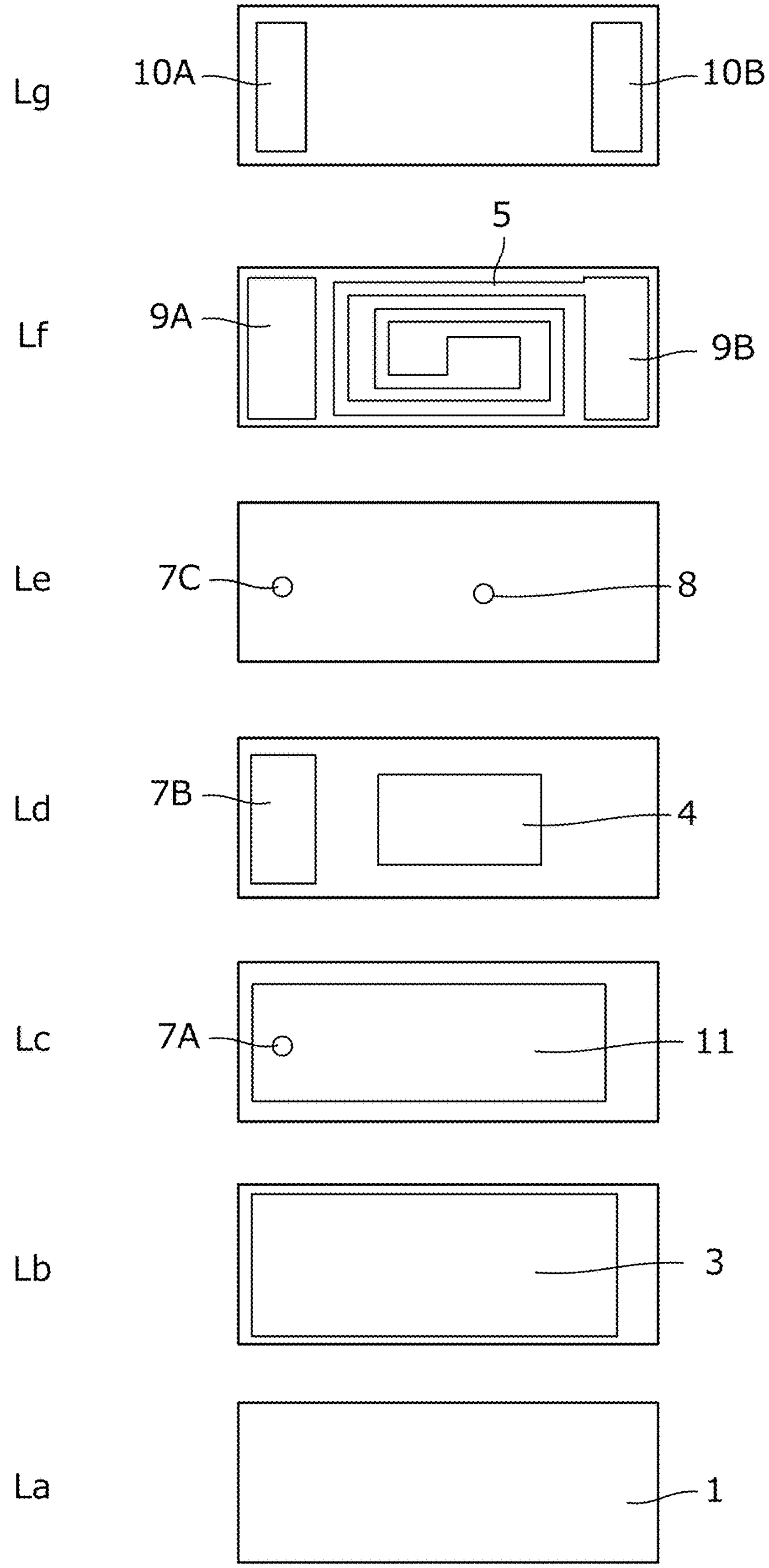
FIG. 8 is a view showing a structure of each layer of the electronic component 102.

FIG. 8 is a view showing a structure of each layer of the electronic component 102. In FIG. 8, a layer La is a layer of the substrate 1, a layer Lb is a layer provided with the planar conductor 3, a layer Lc is a layer provided with the dielectric layer 11 and the planar conductor connecting conductor 7A, and a layer Ld is a layer provided with the planar conductor 4 and the planar conductor connecting conductor 7B. A layer Le is a layer provided with the planar conductor connecting conductors 7C and 8, and a layer Lf is a layer provided with the inductor conductor pattern 5 and the terminal electrodes 9A and 9B. Then, a layer Lg is a provided with the terminal electrodes 10A and 10B.

Figure 9A:
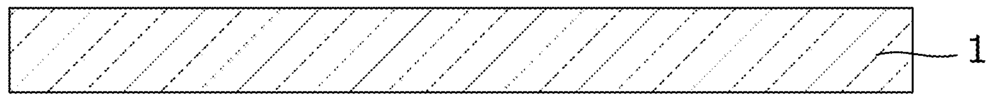
FIG. 9A, FIG. 9B, FIG. 9C, and FIG. 9D are cross-sectional views of the electronic component 102 in respective manufacturing process steps.
Figure 9B:
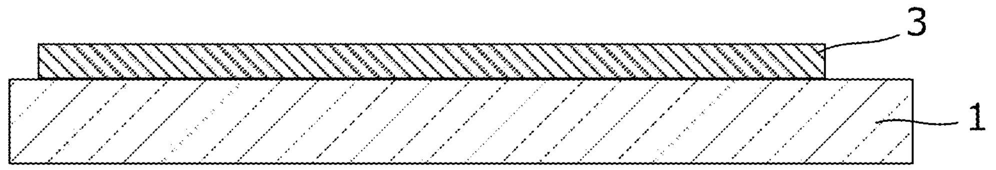

Next, a method of manufacturing the electronic component 102 configured in each layer shown in FIG. 8 will be exemplified. FIG. 9A is a cross-sectional view of the substrate. It is noted that not only a semiconductor substrate, such as a Si substrate and a GaAs substrate, but also a glass substrate or a ceramic substrate can be used for this substrate 1. FIG. 9B is a cross-sectional view in a state in which the planar conductor 3 is provided. In this process step, a semiconductor process such as vapor-depositing and lifting off an Al film or a Cu film on the surface of the substrate 1, or forming an Al film or a Cu film by sputtering or CVD and performing lithography and etching the Al film or the Cu film, or the like, is used.

Figure 9C:
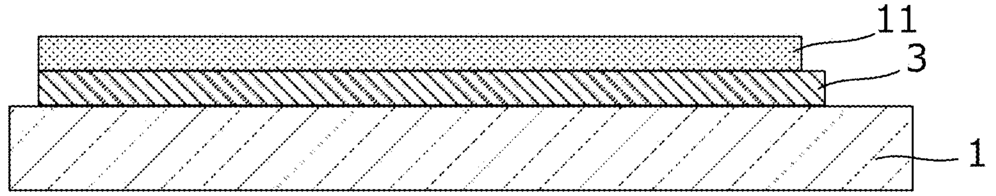
Figure 9D:
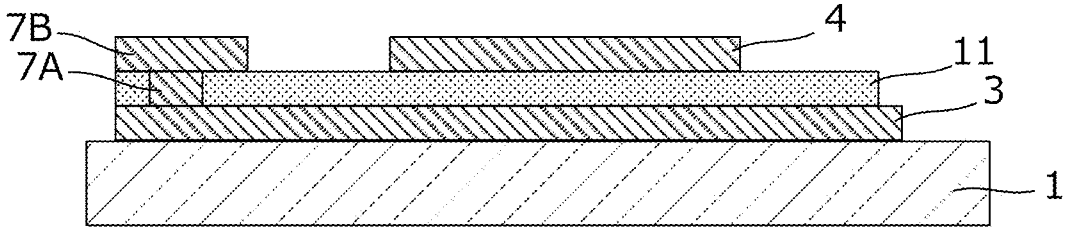

FIG. 9C is a cross-sectional view in a state in which the dielectric layer 11 is provided. In this process step, a semiconductor process, such as forming the dielectric layer 11 including a SiO2 film and a SiN film on a surface of the planar conductor 3 by sputtering or CVD, is used. Subsequently, as shown in FIG. 9D, an aperture is formed in a portion in which the planar conductor connecting conductor 7A is provided, and the planar conductor connecting conductors 7A and 7B and the planar conductor 4 are formed. In this process step, a pattern of the planar conductor 4 is formed in a semiconductor process such as forming an aperture lithography and etching, vapor-depositing and lifting off an Al film or a Cu film, forming an Al film or a Cu film by sputtering or CVD and performing lithography and etching the Al film or the Cu film, or the like.

Figure 10A:
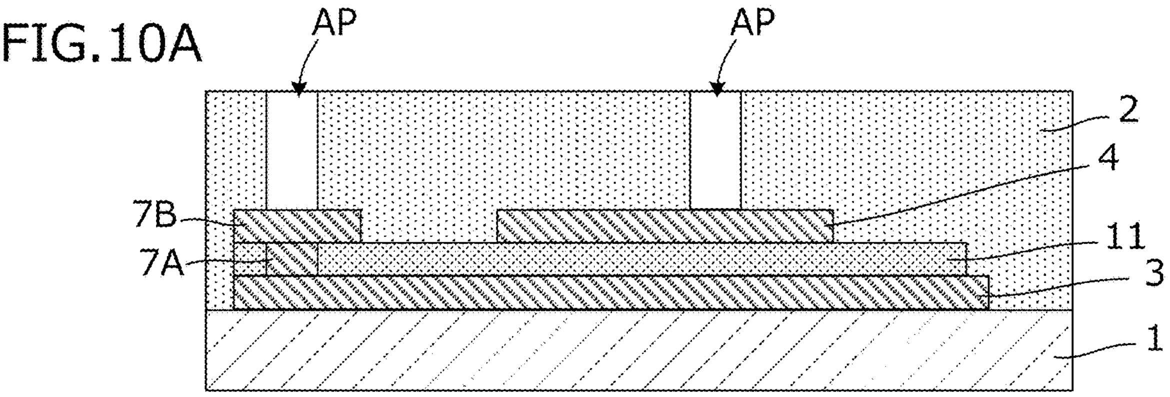
FIG. 10A, FIG. 10B, FIG. 10C, and FIG. 10D are cross-sectional views of the electronic component 102 in respective manufacturing process steps.

FIG. 10A is a cross-sectional view in a state in which the insulator layer 2 is provided and an aperture AP is provided. In this configuration, an inorganic film such as a resin (organic) film, a SiO2 film, or a SiN film is formed by a method such as spin coating, CVD, or sputtering, and, subsequently, the aperture AP is formed in a predetermined place by lithography and etching.

Figure 10B:
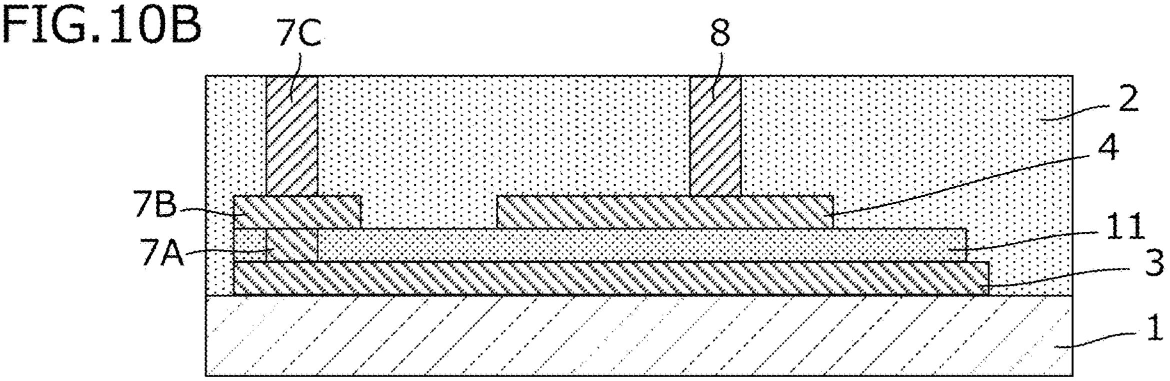

FIG. 10B is a cross-sectional view in a state in which the planar conductor connecting conductors 7C and 8 are provided. In this process step, the planar conductor connecting conductors 7C and 8 are formed in the aperture AP shown in FIG. 10A. For example, the conductors are formed by a method such as forming a Cu film and performing lithography the Cu film and plating Cu, or performing sputtering a Cu film, lithography the Cu film, and etching the Cu film on Cu, or performing lithography a Cu film, vapor-depositing Cu to the Cu film, and liftoff on the Cu film.

Figure 10C:
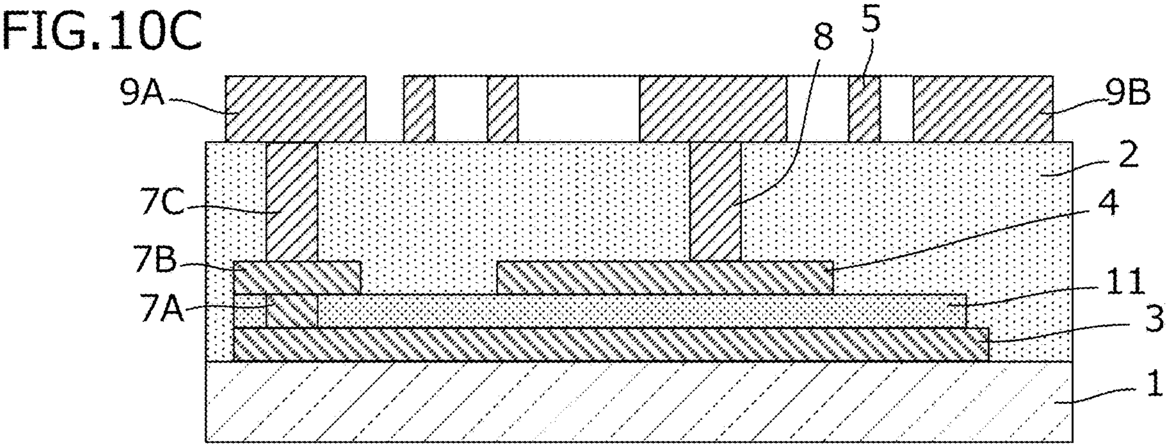

FIG. 10C is a cross-sectional view in a state in which the inductor conductor pattern 5 and the terminal electrodes 9A and 9B are provided. In this process step, the inductor conductor pattern 5 and the terminal electrodes 9A and 9B are formed on the surface of the insulator layer 2. For example, the pattern and the electrodes are formed by a method such as forming a Cu film and performing lithography the Cu film and plating Cu, or performing sputtering a Cu film, lithography the Cu film, and etching the Cu film on Cu, or performing lithography, vapor-depositing Cu to the Cu film, and liftoff on the Cu film.

Figure 10D:
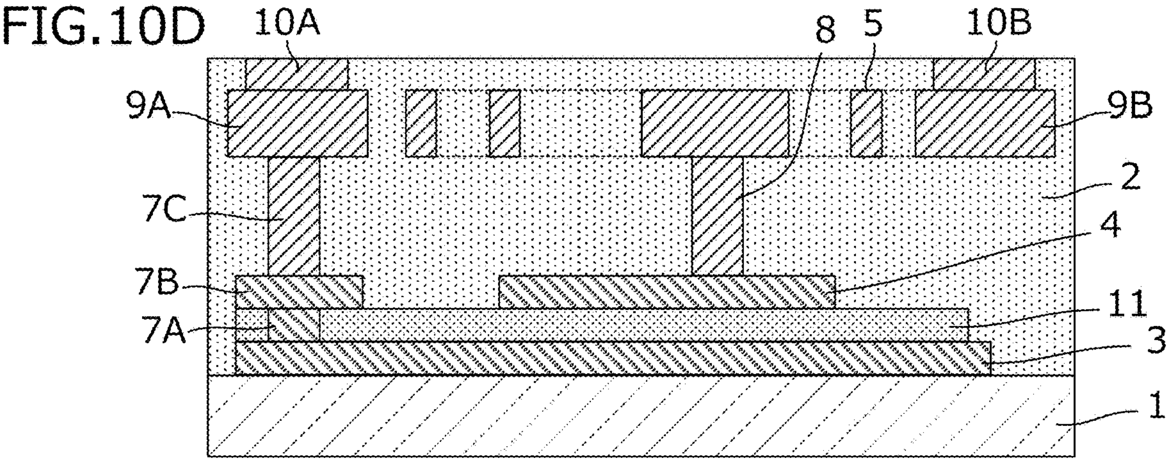

FIG. 10D is a cross-sectional view in a state in which the terminal electrodes 10A and 10B are provided. In this process step, the terminal electrodes 10A and 10B are mounting electrodes, and are formed by applying Ni plating, Au plating, or the like on the surface of the terminal electrodes 9A and 9B. Subsequently, a protective film is formed, and portions of the terminal electrode 10A and 10B are opened to expose the terminal electrodes 10A and 10B.

Third Exemplary Embodiment

In a third exemplary embodiment, an electronic component different in the configuration of the planar conductor from the example shown in the first and second exemplary embodiments will be exemplified.

Figure 11A:
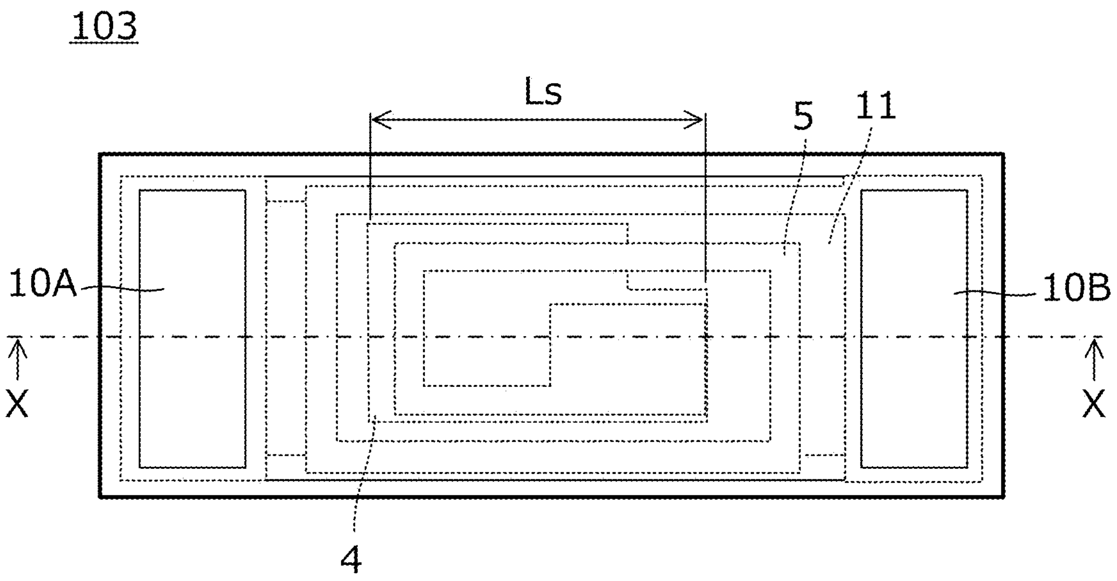
FIGS. 11A and 11B show a plan view and a cross-sectional view of an electronic component 103 according to a third exemplary embodiment of the present disclosure.
Figure 11B:
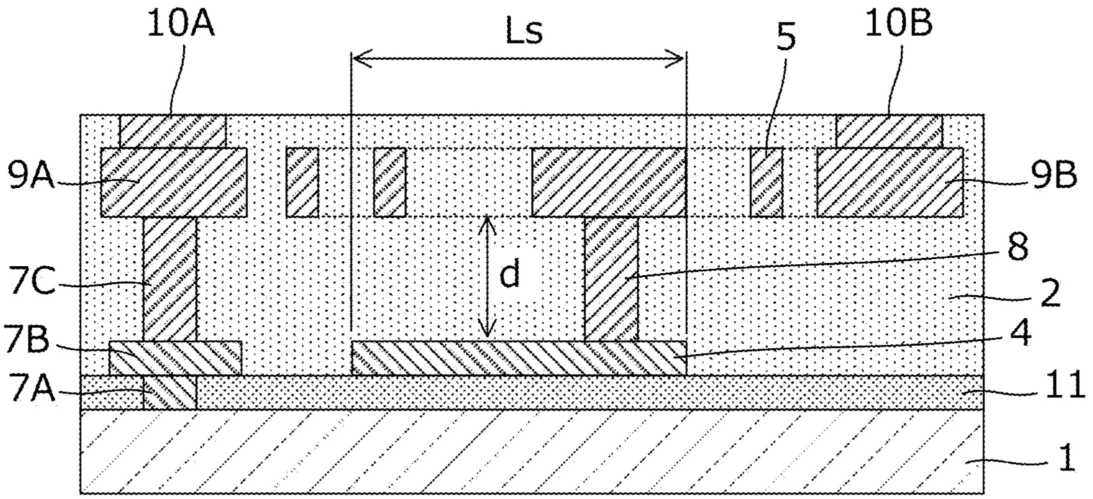

FIGS. 11A and 11B show a structure of an electronic component 103 according to the third exemplary embodiment of the present disclosure. The plan view in FIG. 11A is a plan view of the electronic component 103. The cross-sectional view in FIG. 11B is a cross-sectional view taken along a line X-X in the plan view of the electronic component 103.

The electronic component 103 includes a substrate 1, an insulator layer 2 expanding along (e.g., over) a surface of the substrate 1, an inductor conductor pattern 5 provided in the insulator layer 2, a dielectric layer 11 and a planar conductor 4 provided on the substrate 1 and extending along the substrate 1, a planar conductor connecting conductor 8 electrically connected to the planar conductor 4, and planar conductor connecting conductors 7A, 7B, and 7C electrically connected to the substrate 1.

The dielectric layer 11 is provided on the surface of the substrate 1, and the planar conductor 4 is provided on the surface of this dielectric layer 11. In addition, the planar conductor connecting conductor 7A is provided at a predetermined position of the surface of the substrate 1. The substrate 1 is a semiconductor substrate having high conductivity. It should be appreciated that other configurations are the same or substantially the same as the configurations shown in the second exemplary embodiment.

In the exemplary embodiment of FIGS. 11A and 11B, the value of Ls is 210 μm, and the distance d between the inductor conductor pattern 5 and the planar conductor 4 is 30 μm. Accordingly, Ls/d is 7, and Ls/d is less than 60 and further less than 55. According to the present exemplary embodiment, the ratio Q/Q0 of the Q value Q0 without the planar conductor 4 to the Q value with the planar conductor 4 is 0.61, and thus an electronic component including an inductor with an effective Q value is obtained.

Figure 12:
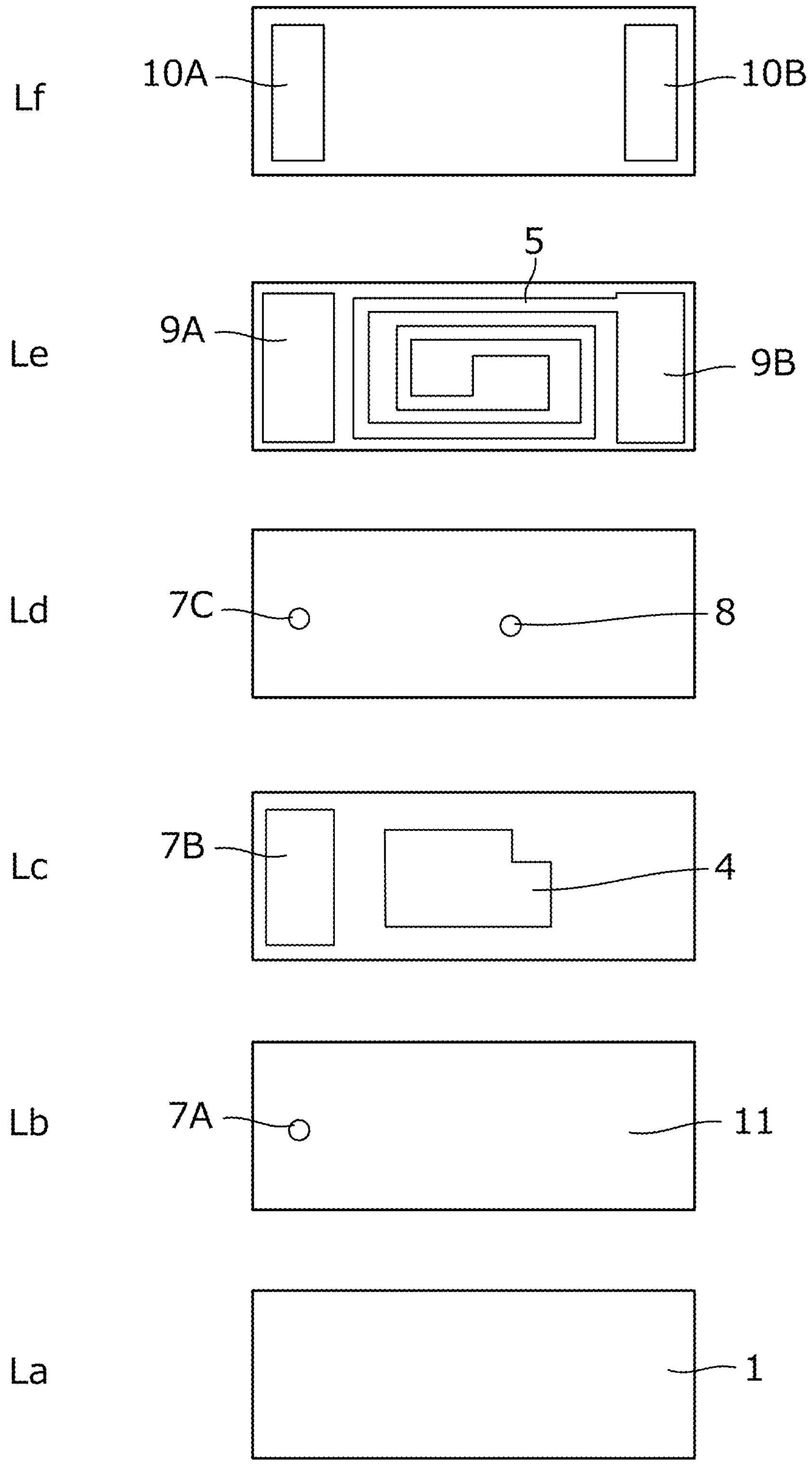
FIG. 12 is a view showing a structure of each layer of the electronic component 103.

FIG. 12 is a view showing a structure of each layer of the electronic component 103. In FIG. 12, a layer La is a layer of the substrate 1, a layer Lb is a layer provided with the planar conductor connecting conductor 7A and the dielectric layer 11, a layer Lc is a layer provided with the dielectric layer 11 and the planar conductor 4, and a layer Ld is a layer provided with the planar conductor connecting conductors 7C and 8. A layer Le is a layer provided with the inductor conductor pattern 5 and the terminal electrodes 9A and 9B. Then, a layer Lf is a layer provided with the terminal electrodes 10A and 10B.

Figure 13A:
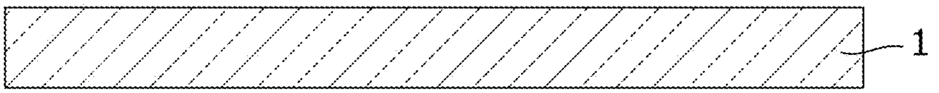
FIG. 13A, FIG. 13B, FIG. 13C, and FIG. 13D are cross-sectional views of the electronic component 103 in respective manufacturing process steps.
Figure 13B:
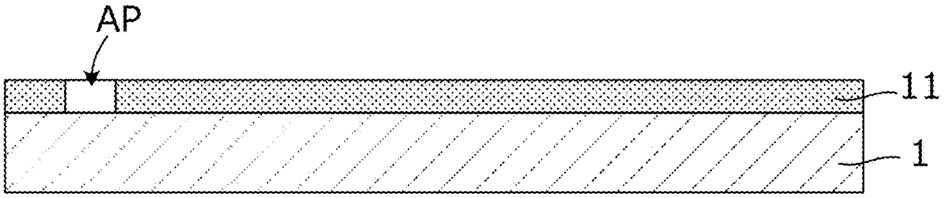
Figure 13C:
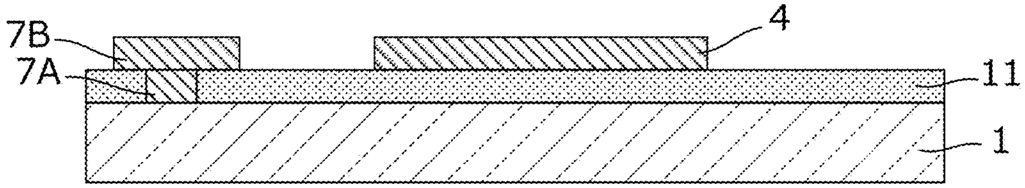
Figure 13D:
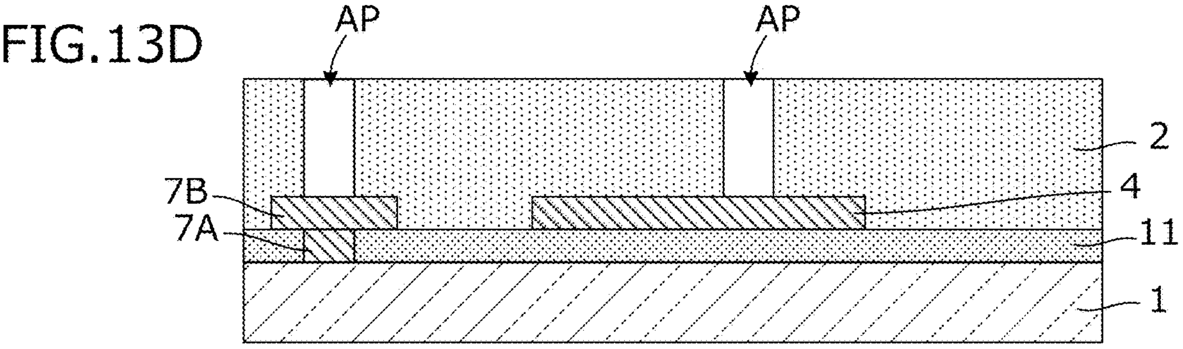

Next, a method of manufacturing the electronic component 103 configured in each layer shown in FIG. 11 will be exemplified. FIG. 13A is a cross-sectional view of the substrate. It is noted that not only a semiconductor substrate, such as a Si substrate and a GaAs substrate, but also a glass substrate or a ceramic substrate can be used for this substrate 1. FIG. 13B is a cross-sectional view in a state in which the dielectric layer 11 is provided and an aperture AP is provided at a predetermined position. FIG. 13C is a cross-sectional view in a state in which the planar conductor connecting conductor 7B and the planar conductor 4 are provided on an upper surface of the dielectric layer 11 while the planar conductor connecting conductor 7A is provided in the aperture AP. FIG. 13D is a cross-sectional view in a state in which the insulator layer 2 is provided and the aperture is provided. In this configuration, an inorganic film such as a resin (organic) film, a SiO2 film, or a SiN film is formed by a method such as spin coating, CVD, or sputtering, and, subsequently, the aperture AP is formed in a predetermined place by lithography and etching.

Figure 14A:
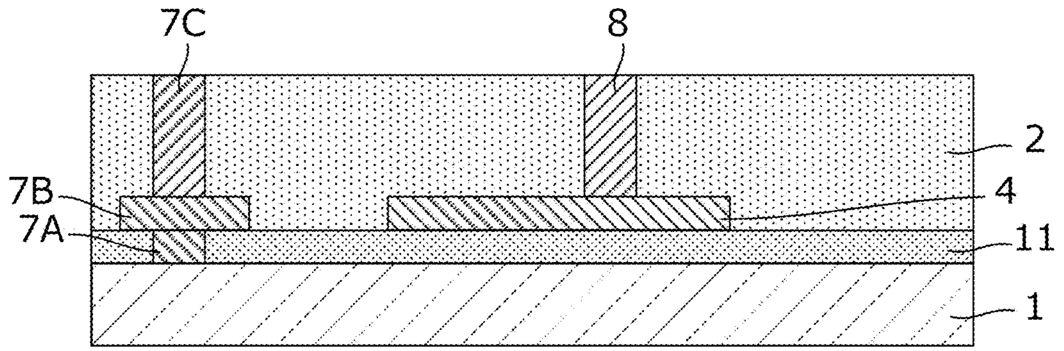
FIG. 14A, FIG. 14B, and FIG. 14C are cross-sectional views of the electronic component 103 in respective manufacturing process steps.

FIG. 14A is a cross-sectional view in a state in which the planar conductor connecting conductors 7C and 8 are provided. In this process step, the planar conductor connecting conductors 7C and 8 are formed in the aperture AP shown in FIG. 13D. For example, the conductors are formed by a method such as forming a Cu film and performing lithography and plating, or performing sputtering, lithography, and etching on Cu, or performing lithography, vapor-depositing, and liftoff on a Cu film.

Figure 14B:
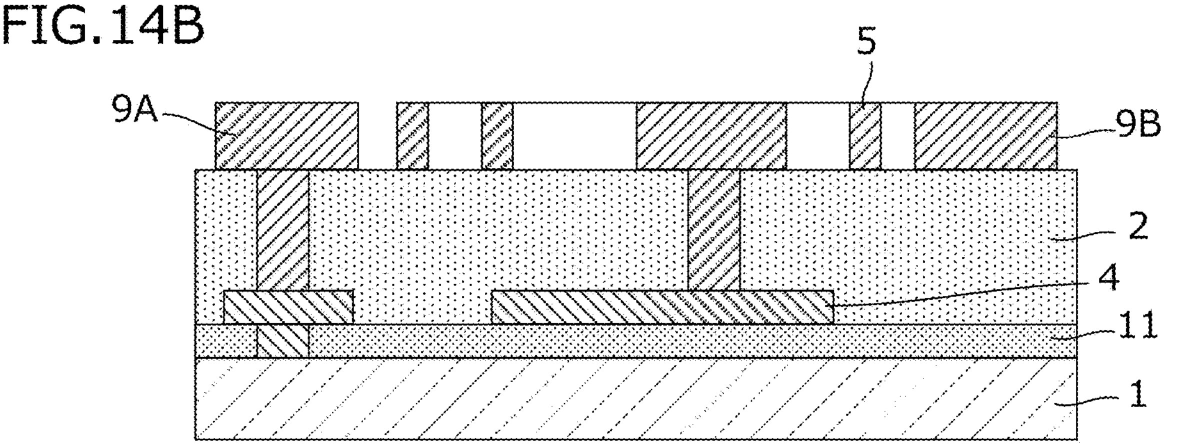

FIG. 14B is a cross-sectional view in a state in which the inductor conductor pattern 5 and the terminal electrodes 9A and 9B are provided. In this process step, the inductor conductor pattern 5 and the terminal electrodes 9A and 9B are formed on the surface of the insulator layer 2. For example, the pattern and the electrodes are formed by a method such as forming a Cu film and performing lithography and plating, or performing sputtering, lithography, and etching on Cu, or performing lithography, vapor-depositing, and liftoff on a Cu film.

Figure 14C:
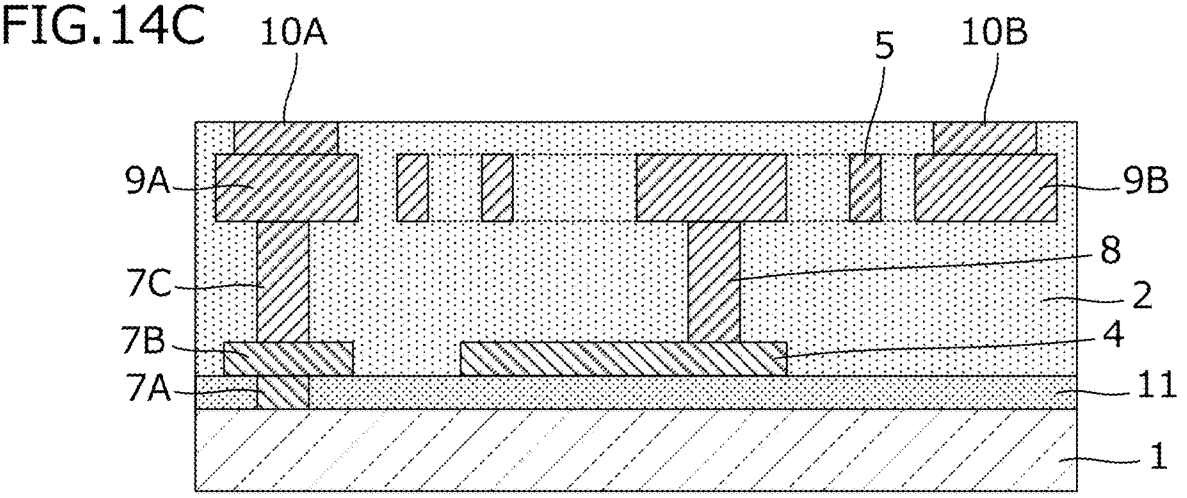

FIG. 14C is a cross-sectional view in a state in which the terminal electrodes 10A and 10B are provided. In this process step, the terminal electrodes 10A and 10B are mounting electrodes, and are formed by applying Ni plating, Au plating, or the like on the surface of the terminal electrodes 9A and 9B. Subsequently, a protective film is formed, and portions of the terminal electrode 10A and 10B are opened to expose the terminal electrodes 10A and 10B.

Fourth Exemplary Embodiment

Figure 15A:
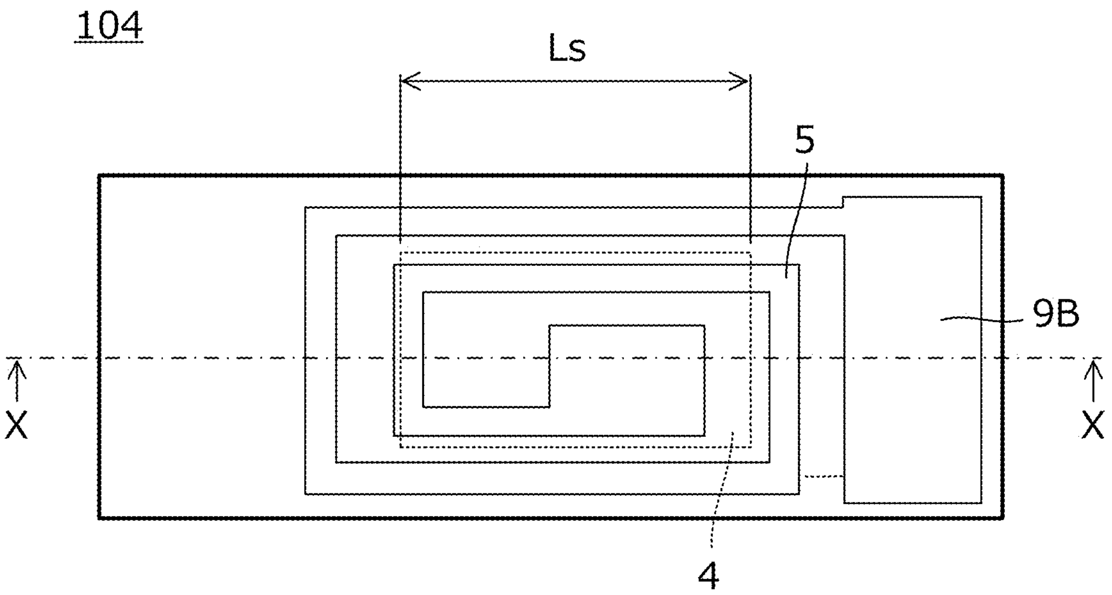
FIGS. 15A and 15B show a plan view and a cross-sectional view of an electronic component 104 according to a fourth exemplary embodiment of the present disclosure.
Figure 15B:
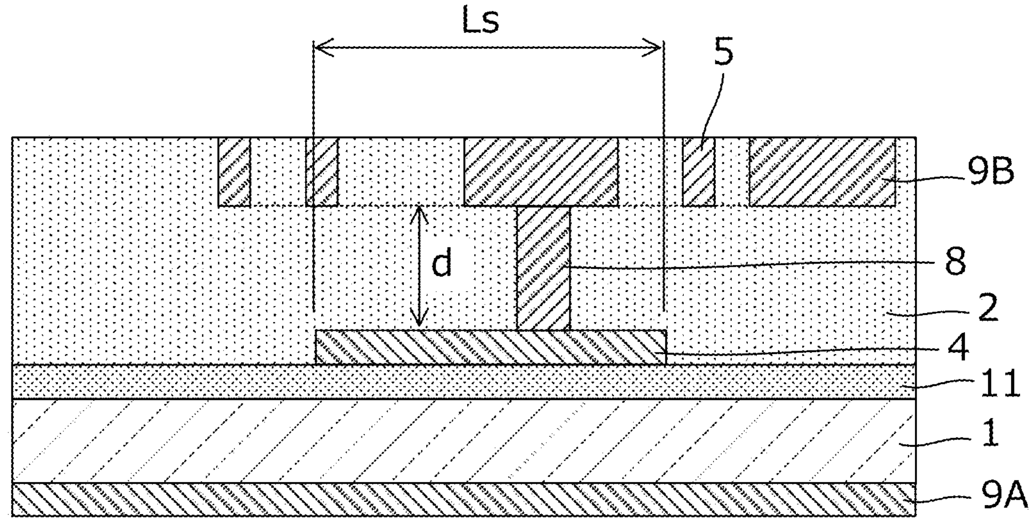

In a fourth exemplary embodiment, an electronic component having a planar conductor on a back surface of the substrate will be exemplified. The plan view in FIG. 15A is a plan view of the electronic component 104. The cross-sectional view in FIG. 15B is a cross-sectional view taken along a line X-X in the plan view of the electronic component 104.

As shown, the electronic component 104 includes a substrate 1, a dielectric layer 11 provided on an upper surface of the substrate 1, a terminal electrodes 9A provided on a lower surface of the substrate 1, an insulator layer 2, an inductor conductor pattern 5 provided in the insulator layer 2, a planar conductor 4 extending along the substrate 1, a planar conductor connecting conductor 8 electrically connected to the planar conductor 4.

The electronic component 104 according to the present exemplary embodiment uses capacitance generated between the planar conductor 4 and the terminal electrode 9A, as capacitor. In addition, the electronic component 104 uses the terminal electrodes 9A and 9B on the upper and lower surfaces.

The value of Ls according to the present exemplary embodiment is 210 μm, and the value of d is 30 μm. The electronic component 104 is the same as the electronic component 103 shown in the third exemplary embodiment, except for having a back-surface electrode. Accordingly, the value of Ls/d is the same as the result shown in the third exemplary embodiment.

Fifth Exemplary Embodiment

In a fifth exemplary embodiment, an electronic component having three terminal electrodes and an electronic component including a resistance element will be exemplified.

Figure 16A:
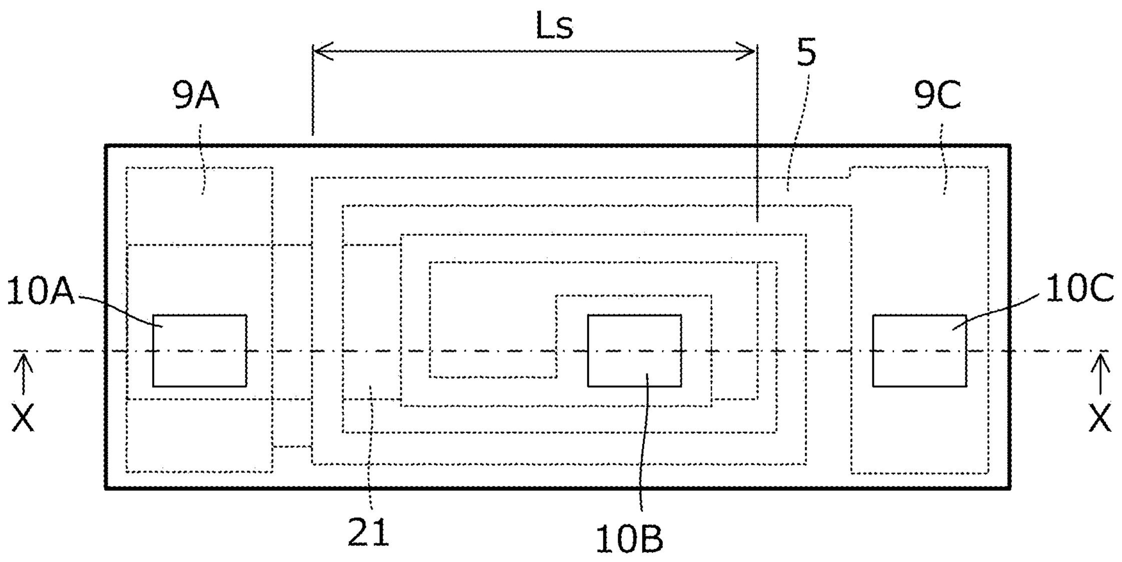
FIGS. 16A and 16B show a plan view and a cross-sectional view of an electronic component 105 according to a fifth exemplary embodiment of the present disclosure.
Figure 16B:
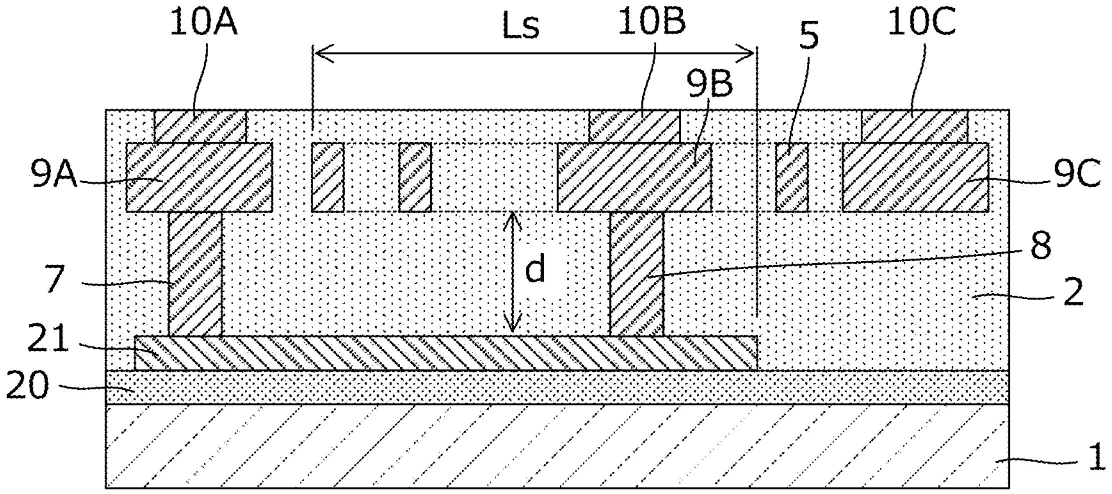

FIGS. 16A and 16B shows a structure of an electronic component 105 according to the fifth exemplary embodiment of the present disclosure. The plan view in FIG. 16A is a plan view of the electronic component 105. The cross-sectional view in FIG. 16B is a cross-sectional view taken along a line X-X in the plan view of the electronic component 105.

As shown, the electronic component 105 includes a substrate 1, an insulator film 20 expanding along (e.g., over) a surface of this substrate 1, an inductor conductor pattern 5 provided in the insulator layer 2, a resistor film 21 provided on the insulator film 20 and extending along the insulator film 20, a planar conductor connecting conductor 7 electrically connected to the resistor film 21 and the terminal electrode 9A, and a planar conductor connecting conductor 8 electrically connected to the resistor film 21 and the terminal electrode 9B. In the present exemplary embodiment, the resistor film 21 is equivalent to the planar conductor according to the present disclosure.

Figure 17:
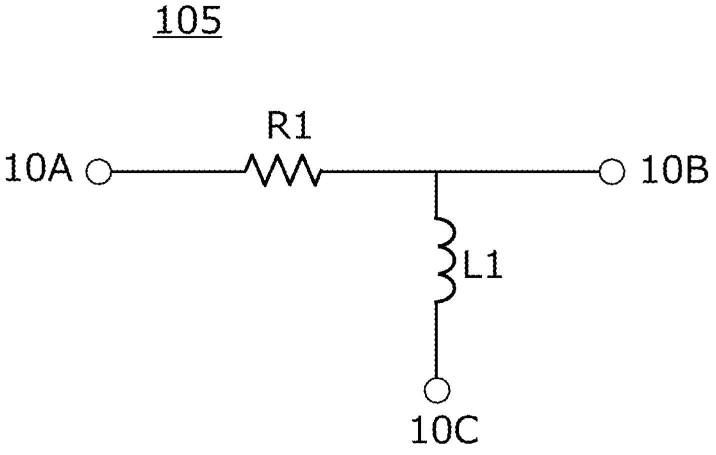
FIG. 17 is an equivalent circuit diagram of the electronic component 105.

FIG. 17 is an equivalent circuit diagram of the electronic component 105. In such a manner, the electronic component 105 configures a composite component of the inductor L1 and a resistance element R1.

Figure 18:
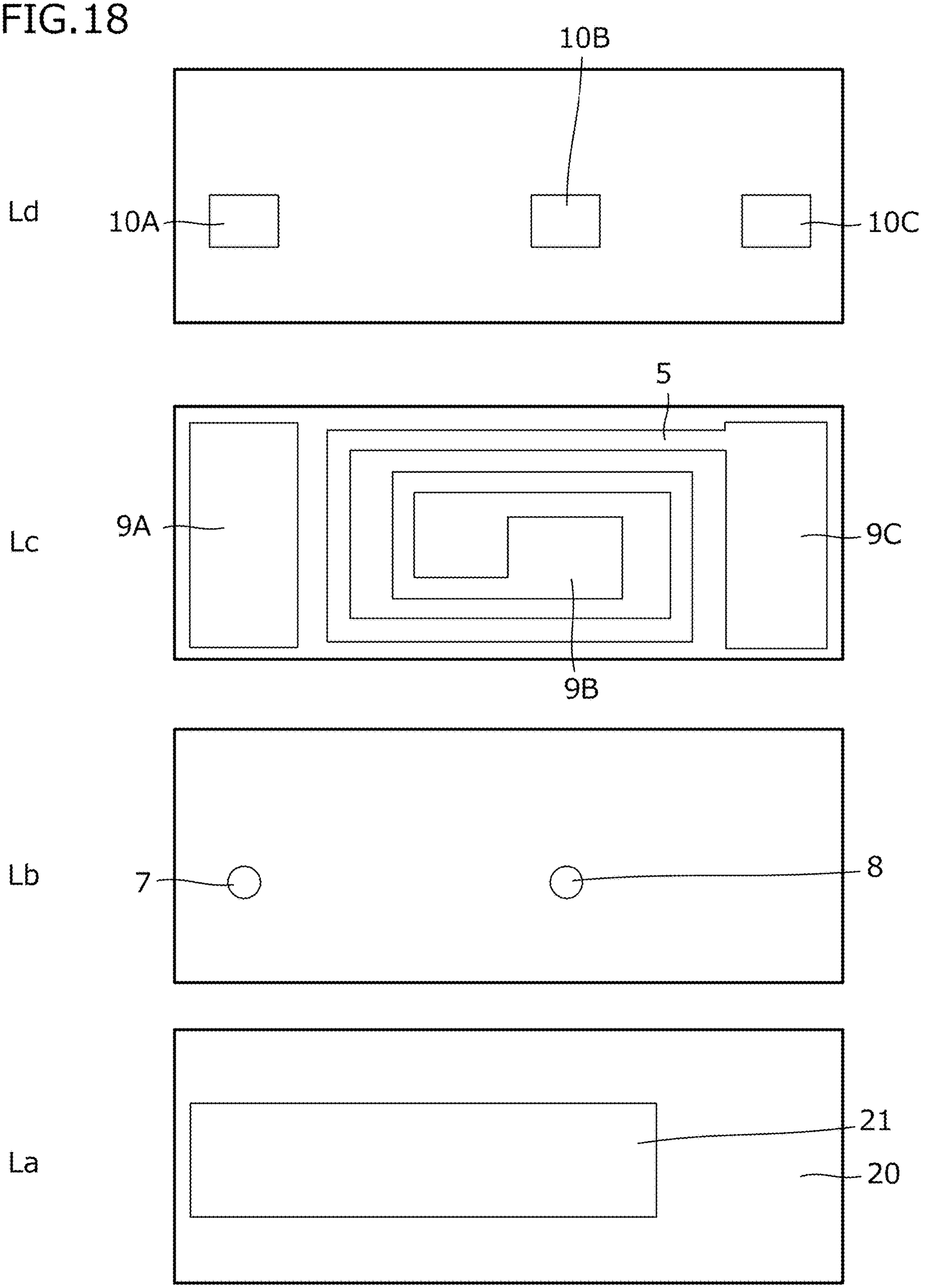
FIG. 18 is a view showing a structure of each layer of the electronic component 105.

FIG. 18 is a view showing a structure of each layer of the electronic component 105. In FIG. 18, a layer La is a layer provided with the insulator film 20 and the resistor film 21, a layer Lb is a layer provided with the planar conductor connecting conductors 7 and 8, and a layer Lc of a layer provided with the inductor conductor pattern 5 and terminal electrodes 9A, 9B, and 9C. Then, a layer Ld is a layer provided with terminal electrodes 10A, 10B, and 10C.

Figure 19A:
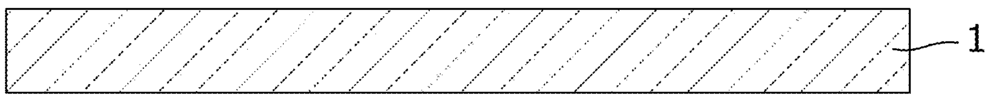
FIG. 19A, FIG. 19B, FIG. 19C, and FIG. 19D are cross-sectional views of the electronic component 105 in respective manufacturing process steps.
Figure 19B:
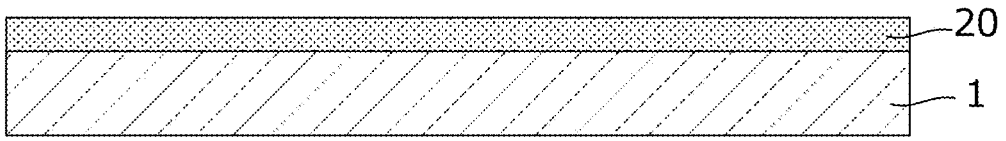
Figure 19C:
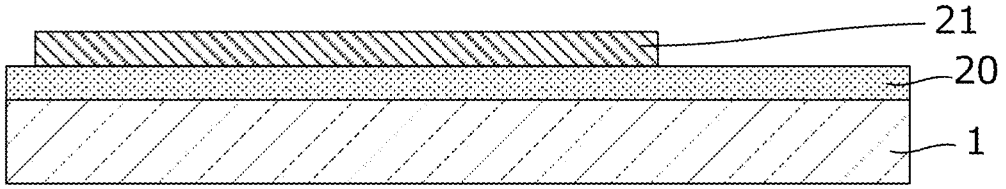
Figure 19D:
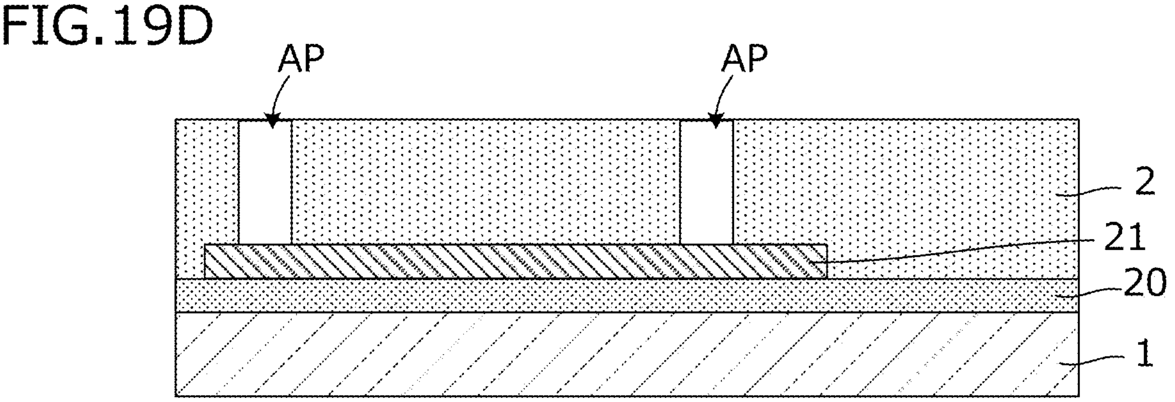

Next, a method of manufacturing the electronic component 105 configured in each layer shown in FIG. 18 will be exemplified. FIG. 19A is a cross-sectional view of the substrate. FIG. 19B is a cross-sectional view in a state in which the insulator film 20 is provided. FIG. 19C is a cross-sectional view in a state in which the resistor film 21 is provided on the insulator film 20. FIG. 19D is a cross-sectional view in a state in which the insulator layer 2 is provided and the aperture AP is provided.

According to an exemplary aspect, the resistor film 21 can be made of a material having conductivity between the conductivity of an insulator layer and the conductivity of a conductive material that forms a terminal electrode or an inductor conductor pattern. The resistor film 21 may be a film in which an insulator and a conductive material are stacked, in addition to NiCr, Si including impurities, or the like, for example.

Figure 20A:
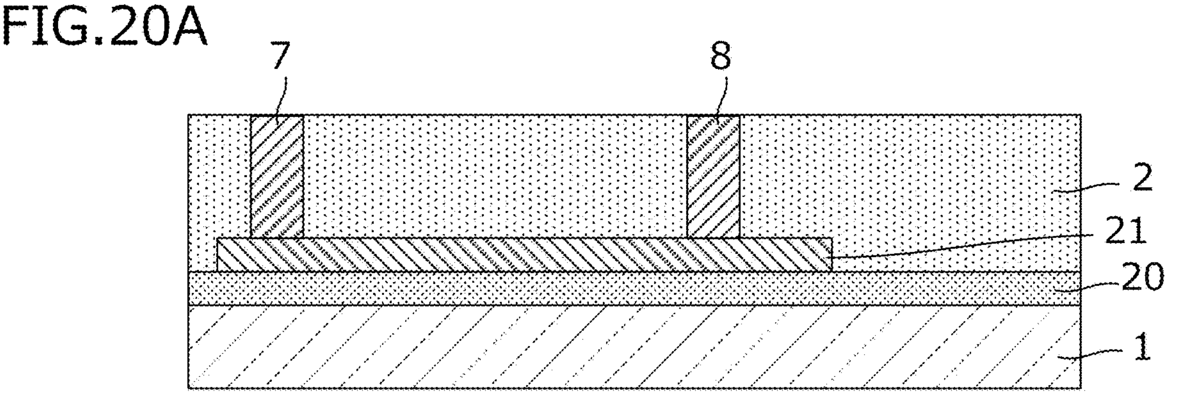
FIG. 20A, FIG. 20B, and FIG. 20C are cross-sectional views of the electronic component 105 in respective manufacturing process steps.

FIG. 20A is a cross-sectional view in a state in which the planar conductor connecting conductors 7 and 8 are provided. In this process step, the planar conductor connecting conductors 7 and 8 are formed in the aperture AP shown in FIG. 19D.

Figure 20B:
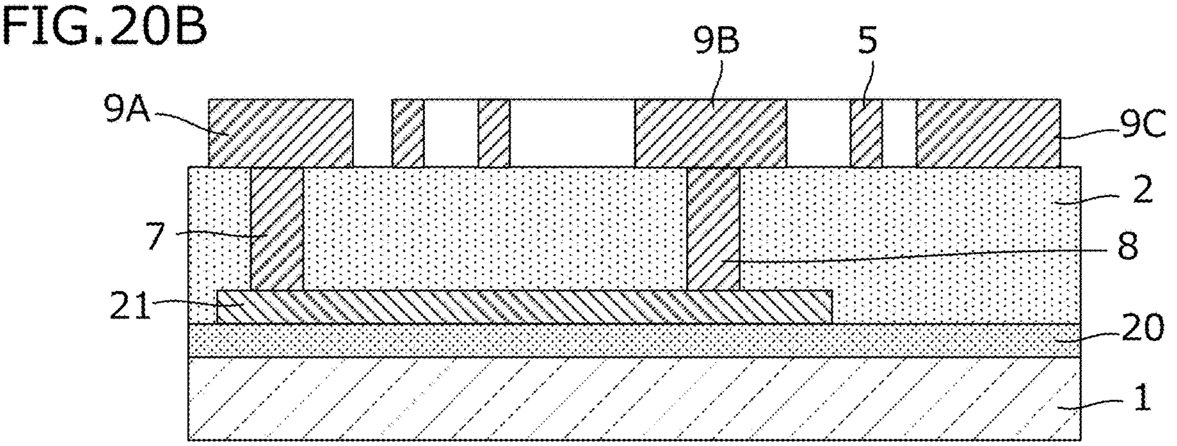

FIG. 20B is a cross-sectional view in a state in which the inductor conductor pattern 5 and the terminal electrodes 9A, 9B, and 9C are provided. In this process step, the inductor conductor pattern 5 and the terminal electrodes 9A, 9B, and 9C are formed on the surface of the insulator layer 2.

Figure 20C:
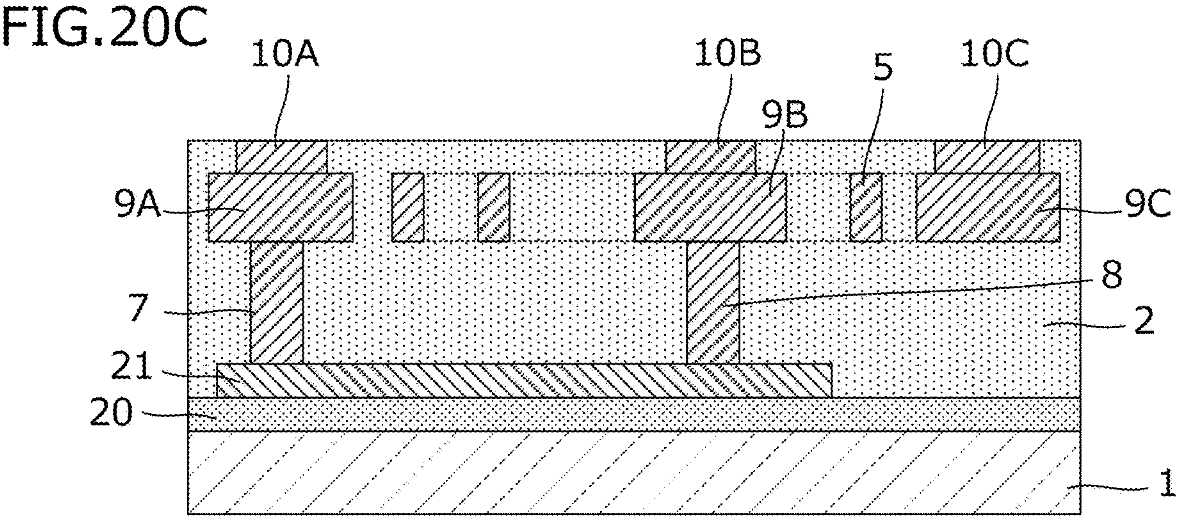

FIG. 20C is a cross-sectional view in a state in which the mounting terminal electrodes 10A, 10B, and 10C are provided. In this process step, nickel plating, Au plating, or the like are performed on the surface of the terminal electrodes 9A, 9B, and 9C. Subsequently, a protective film is formed, and portions of the terminal electrodes 10A, 10B, and 10C are opened to expose the terminal electrodes 10A, 10B, and 10C.

The value of Ls according to the present exemplary embodiment is 250 μm, the value of d is 30 μm, and Ls/d is about 8.3. In this example as well, Ls/d is less than 55, and Q/Q0 is 0.52, so that an electronic component of which the Q value of the inductor is large enough is obtained.

Sixth Exemplary Embodiment

In a sixth exemplary embodiment, an electronic component having a capacitor electrode inside a dielectric layer will be exemplified.

Figure 21:
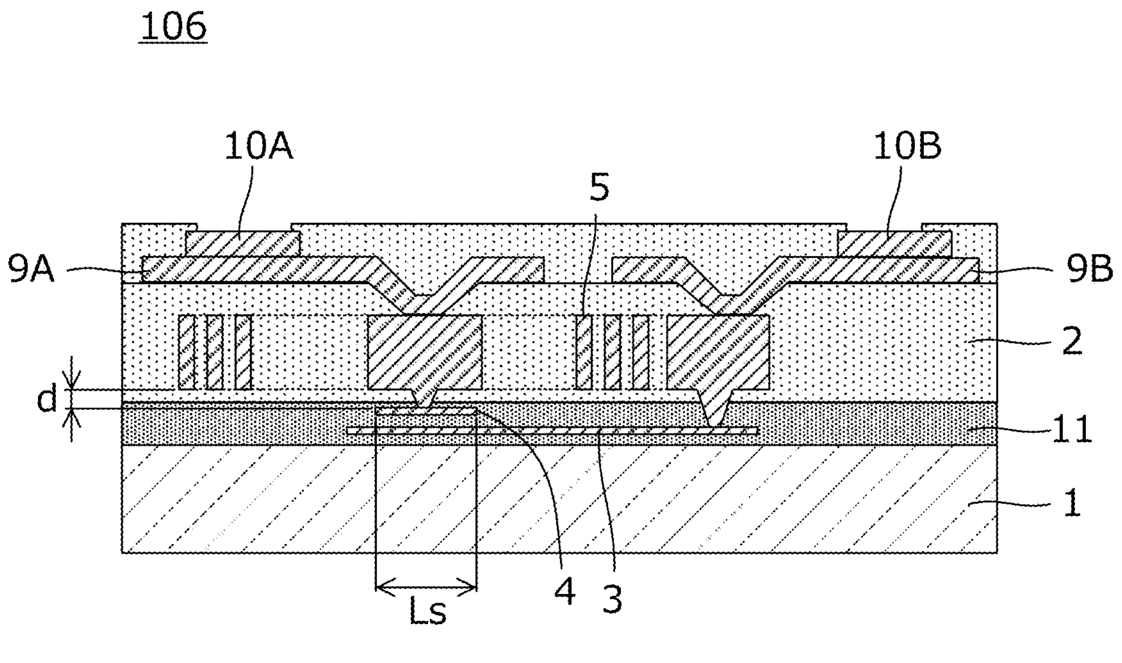
FIG. 21 is a cross-sectional view of an electronic component 106 according to a sixth exemplary embodiment of the present disclosure.

FIG. 21 is a cross-sectional view of an electronic component 106 according to the sixth exemplary embodiment of the present disclosure. This electronic component 106 includes a substrate 1, a dielectric layer 11 expanding along a surface of the substrate 1, planar conductors 3 and 4 provided in the dielectric layer 11, an inductor conductor pattern 5 (e.g., a spiral coil type) provided in the insulator layer 2, and terminal electrodes 9A, 9B, 10A, and 10B. One end of the inductor conductor pattern 5 is electrically connected to the planar conductor 4 and the terminal electrode 9A, and the other end of the inductor conductor pattern 5 is electrically connected to the planar conductor 3 and the terminal electrode 9B. In this aspect, the electronic component 106 configures a parallel circuit of an inductor and a capacitor.

In the present exemplary embodiment as well, a length in a longitudinal direction of a region in which a region where the inductor conductor pattern 5 overlaps the planar conductor 4 is represented by Ls, and a distance between the inductor conductor pattern and the planar conductor is represented by d, the value of Ls/d is 1 or more and 60 or less.

It is noted that, each of the above exemplary embodiments, while describing an example in which the inductor conductor pattern has an aperture MH of magnetic flux $\varphi$ in which the magnetic flux concentrates and the planar conductor is disposed in the entirety or a part of the aperture MH and not describing necessarily specify an example in which the planar conductor covers the whole of the aperture MH of magnetic flux $\varphi$, the planar conductor may cover the whole of the aperture MH of magnetic flux Q.

In addition, each of the above exemplary embodiments, while describing the electronic component including the capacitor or the resistance element as a passive component in addition to the inductor, can similarly configure an electronic component including both the capacitor and the resistance element as a passive component. Moreover, an electronic component including a passive component including a plurality of capacitors and a plurality of inductors can also be configured.

Moreover, the exemplary aspects of the present disclosure are similarly applicable to an LC parallel resonant circuit, or an electronic component used as a band pass filter including a plurality of inductors and capacitors, a diplexer, or the like.

Further, in the exemplary aspects of the present disclosure, the substrate is a semiconductor substrate, and the planar conductor is similarly applicable to an electronic component that configures a semiconductor active element together with the semiconductor substrate. For example, the present disclosure is similarly applicable mainly to a high-frequency power amplifier in which an active component is provided in the semiconductor substrate.

Finally, the exemplary aspects of the present disclosure are not limited to the foregoing exemplary embodiments. Various modifications or changes can be appropriately made by those skilled in the art. Furthermore, the scope of the present disclosure is intended to include all possible modifications or changes from the exemplary embodiments within the scopes of the claims and the scopes of equivalents.

The exemplary configurations of the electronic component of the present disclosure will be described below.

<1> An electronic component is provided that includes a substrate, an insulator layer expanding over a surface of the substrate, at least one planar conductor on the substrate or in the insulator layer and expanding in a plane parallel to the surface of the substrate, and an inductor conductor pattern on the insulator layer or in the insulator layer are included. In this aspect, when viewed in a direction perpendicular to the surface of the substrate, a length in a longitudinal direction of a single region in which a region where the inductor conductor pattern overlaps the at least one planar conductor, or a length in the longitudinal direction being a total length in a predetermined direction of a plurality of regions in which the region where the inductor conductor pattern overlaps the at least one planar conductor is represented by Ls. Moreover, a distance between the inductor conductor pattern and the planar conductor closest to the inductor conductor pattern is represented by d, and Ls/d is 1 or more and 60 or less.

<2> The electronic component according to <1> in which the value of Ls/d is 1 or more and 55 or less.

<3> The electronic component according to <1> or <2> in which a dielectric layer provided between the substrate and the insulator layer is further included, and the at least one planar conductor is a capacitor electrode that configure a capacitor together with the dielectric layer.

<4> The electronic component according to <1> or <2> in which the substrate is a semiconductor substrate of a low resistance, and the at least one planar conductor is a capacitor electrode that configure a capacitor together with the semiconductor substrate.

<5> The electronic component according to <1> or <2> in which the substrate is a semiconductor substrate, and the at least one planar conductor configures a semiconductor active element together with the semiconductor substrate.

<6> The electronic component according to any one of <1> to <5> in which the at least one planar conductor is a resistor thin film.

<7> The electronic component according to any one of <1> to <6> in which the inductor conductor pattern has an aperture of magnetic flux in which the magnetic flux is concentrated, and the at least one planar conductor is in the aperture.

<8> The electronic component according to <7> in which the at least one planar conductor covers an entirety of the aperture.

REFERENCE SIGNS LIST

AP—aperture
C1—capacitor
d—distance
EC—eddy current
Ls—length in longitudinal direction
L1—inductor
Lx—width
Ly—height
La, Lb, Lc, Ld, Le, Lf, Lg—layer
MH—aperture of magnetic flux
R1—resistance element
p—magnetic flux
1—substrate
2—insulator layer
3, 4—planar conductor
5—inductor conductor pattern
7, 8—planar conductor connecting conductor
7A, 7B, 7C, 8—planar conductor connecting conductor
9A, 9B, 9C, 10A, 10B, 10C—terminal electrode
11—dielectric layer
20—insulator film
21—resistor film
101 to 106—electronic component

The invention claimed is:

1. An electronic component comprising:
a substrate;

an insulator layer expanding over a surface of the substrate;

at least one planar conductor on the substrate or in the insulator layer, the at least one planar conductor expanding in a plane parallel to the surface of the substrate; and an inductor conductor pattern on or in the insulator layer, wherein, when viewed in a direction perpendicular to the surface of the substrate, a length in a longitudinal direction of a single region in which a region where the inductor conductor pattern overlaps the at least one planar conductor, or a length in the longitudinal direction being a total length in a predetermined direction of a plurality of regions in which the region where the inductor conductor pattern overlaps the at least one planar conductor is represented by Ls, and wherein a distance between the inductor conductor pattern and the at least one planar conductor closest to the inductor conductor pattern is represented by d, and Ls/d is 1 or more and 60 or less.

2. The electronic component according to claim 1, wherein Ls/d is 1 or more and 55 or less.

3. The electronic component according to claim 1, further comprising a dielectric layer between the substrate and the insulator layer, wherein the at least one planar conductor is a capacitor electrode that configures a capacitor with the dielectric layer.

4. The electronic component according to claim 1, wherein:

the substrate is a semiconductor substrate of a low resistance; and the at least one planar conductor is a capacitor electrode that configures a capacitor with the semiconductor substrate.

5. The electronic component according to claim 1, wherein:

the substrate is a semiconductor substrate; and the at least one planar conductor configures a semiconductor active element with the semiconductor substrate.

6. The electronic component according to claim 1, wherein the at least one planar conductor is a resistor thin film.

7. The electronic component according to claim 1, wherein:

the inductor conductor pattern has an aperture of magnetic flux in which a magnetic flux is concentrated; and the at least one planar conductor is in the aperture.

8. The electronic component according to claim 7, wherein the at least one planar conductor covers an entirety of the aperture.

9. The electronic component according to claim 1, wherein the surface of the substrate is a first surface of the substrate and the inductor conductor pattern is on the first surface, and the at least one planar conductor is on a second surface of the substrate that is opposite the first surface.

10. The electronic component according to claim 1, wherein the longitudinal direction is parallel to the surface of the substrate.

11. An electronic component comprising:

a substrate;

an insulator layer over a first surface of the substrate;

a planar conductor at a second surface of the substrate that is opposite the first surface, the planar conductor extending in a plane parallel to the second surface of the substrate; and an inductor conductor pattern on or in the insulator layer, wherein, when viewed in a direction perpendicular to the first surface of the substrate, a length in a longitudinal direction of a region where the inductor conductor pattern overlaps the planar conductor is represented by Ls, wherein a distance in a thickness direction between the inductor conductor pattern and the planar conductor is represented by d, and wherein Ls/d is 1 or more and 60 or less.

12. The electronic component according to claim 11, wherein the longitudinal direction is parallel to the first surface of the substrate.

13. The electronic component according to claim 11, wherein Ls/d is 1 or more and 55 or less.

14. The electronic component according to claim 11, further comprising a dielectric layer between the substrate and the insulator layer, wherein the planar conductor is a capacitor electrode that configures a capacitor with the dielectric layer.

15. The electronic component according to claim 11, wherein:

the substrate is a semiconductor substrate of a low resistance; and the planar conductor is a capacitor electrode that configures a capacitor with the semiconductor substrate.

16. The electronic component according to claim 11, wherein:

the substrate is a semiconductor substrate; and the planar conductor configures a semiconductor active element with the semiconductor substrate.

17. The electronic component according to claim 11, wherein the planar conductor is a resistor thin film.

18. The electronic component according to claim 11, wherein:

the inductor conductor pattern has an aperture of magnetic flux in which a magnetic flux is concentrated; and the conductor is in the aperture.

19. The electronic component according to claim 18, wherein the planar conductor covers an entirety of the aperture.

20. The electronic component according to claim 11, wherein the inductor conductor pattern is on the first surface of the substrate.

* * * * *